United States Patent [19]

Hollars et al.

[11] Patent Number: 5,972,184
[45] Date of Patent: Oct. 26, 1999

[54] HEATING SYSTEM FOR HIGH THROUGHPUT SPUTTERING

[75] Inventors: Dennis R. Hollars, Los Gatos; Delbert F. Waltrip, San Jose; Robert B. Zubeck, Los Altos; Josef Bonigut, Alamo; Robert M. Smith, Antioch; Gary L. Payne, Sunnyvale, all of Calif.

[73] Assignee: Seagate Technology, Inc., Scotts Valley, Calif.

[21] Appl. No.: 08/045,975

[22] Filed: Apr. 9, 1993

Related U.S. Application Data

[62] Division of application No. 07/681,866, Apr. 4, 1991, abandoned.

[51] Int. Cl.$^6$ ................................................. G23C 14/34
[52] U.S. Cl. .............................. 204/298.09; 204/298.03; 204/298.25; 204/298.26
[58] Field of Search ........................ 204/192.12, 192.2, 204/298.03, 298.25, 298.26, 298.27, 298.28, 298.29, 298.09

[56] References Cited

U.S. PATENT DOCUMENTS

| | | | |
|---|---|---|---|
| 4,663,009 | 5/1987 | Bloomquist et al. | 204/298.25 X |
| 4,749,465 | 6/1988 | Flint et al. | 204/298.25 |
| 4,894,133 | 1/1990 | Hedgroth | 204/298.25 X |
| 5,126,027 | 6/1992 | Kudo et al. | 204/298.25 X |
| 5,147,168 | 9/1992 | Sawa et al. | 204/298.25 X |
| 5,244,554 | 9/1993 | Yamagata et al. | 204/298.25 X |

OTHER PUBLICATIONS

Charschan et al., "A Continuous Vacuum Processing Machine", The Western Electric Engineer, p. 9–17, Feb. 1964.

Primary Examiner—Nam Nguyen
Assistant Examiner—Steven H. VerSteeg
Attorney, Agent, or Firm—Fliesler, Dubb, Meyer & Lovejoy

[57] ABSTRACT

A high throughput sputtering apparatus which provides a single or multi-layer coating to the surface of a plurality of substrates. The apparatus comprises a plurality of buffer and sputtering chambers which include an input end and an output end. The substrates are transported through the chambers at varying rates of speed such that the rate of speed of a pallet from the input end to the output end is a constant for each of the pallets. The high throughput sputtering apparatus also includes a transport system which transports the substrates through the sputtering chambers at variable velocities, a high capacity vacuum pump system which evacuates the ambient pressure within the sputtering chambers to a vacuum level within a pressure range sufficient to enable sputtering operation, a substrate heating system which heats the substrates to a temperature conducive to sputtering the coatings thereon and provides a substantially uniform temperature profile over the surface of the substrates; and an electronic control system which provides control signals to and for receiving feedback input from other components of the apparatus. The electronic control system is programmable to control the sputtering chambers, the transport system, the vacuum pump system, and the substrate heating system. The substrate heating system efficiently maintains a desired substrate temperature by minimizing radiative heat losses as the substrates proceed through the sputtering apparatus. The high throughput sputtering apparatus provides substrates to be sputtered in a rapid and uniform heating process to optimize film integrity during the sputtering steps, provides successive layers of thin films on the substrates, and removes the sputtered substrates without contaminating the environment.

16 Claims, 36 Drawing Sheets

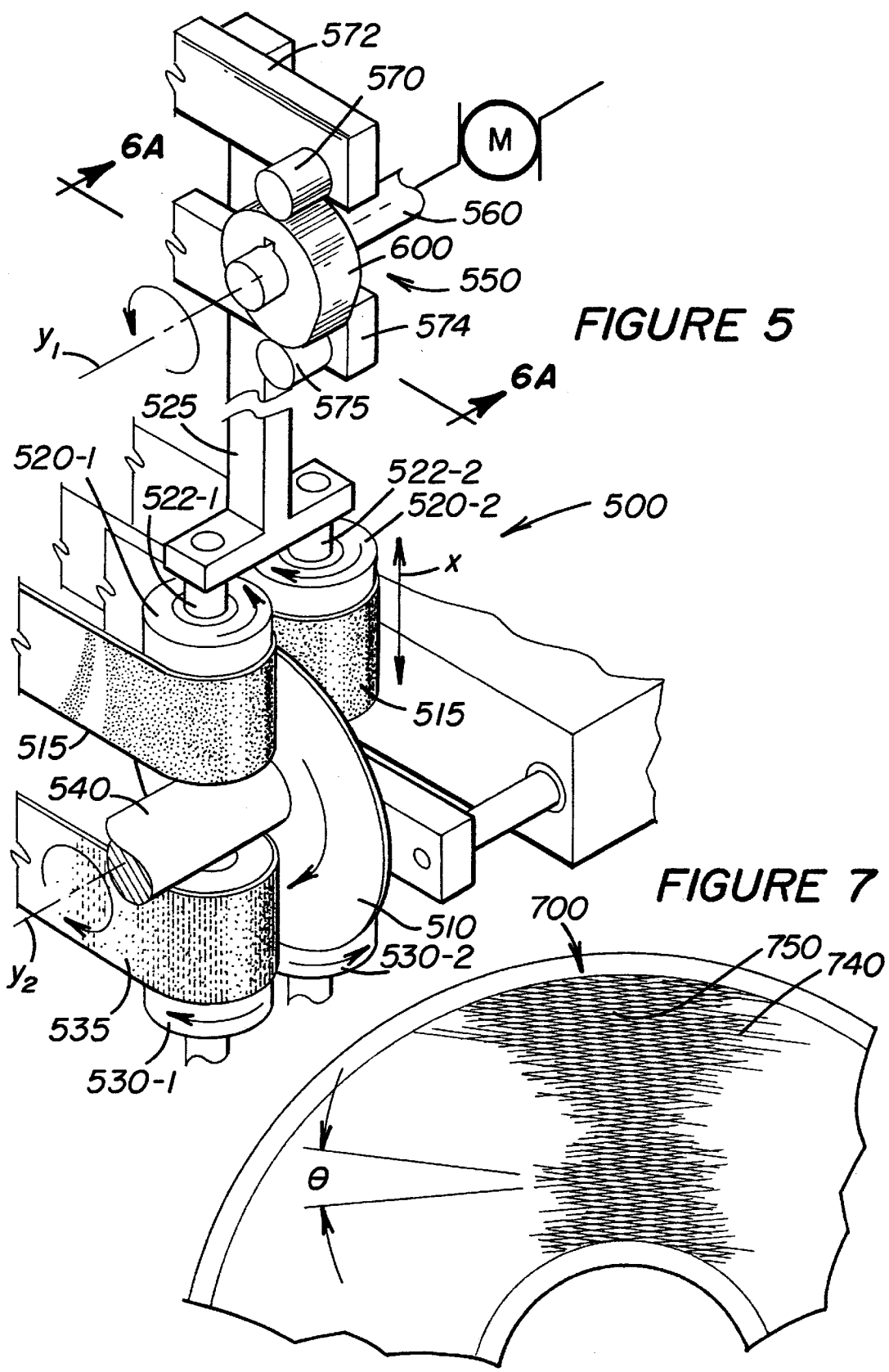

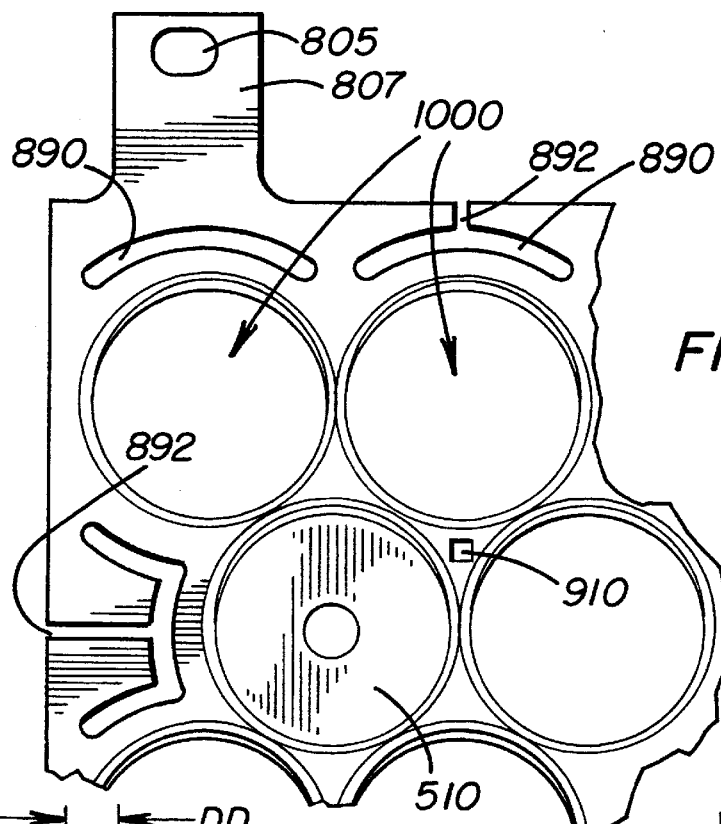
FIGURE 9
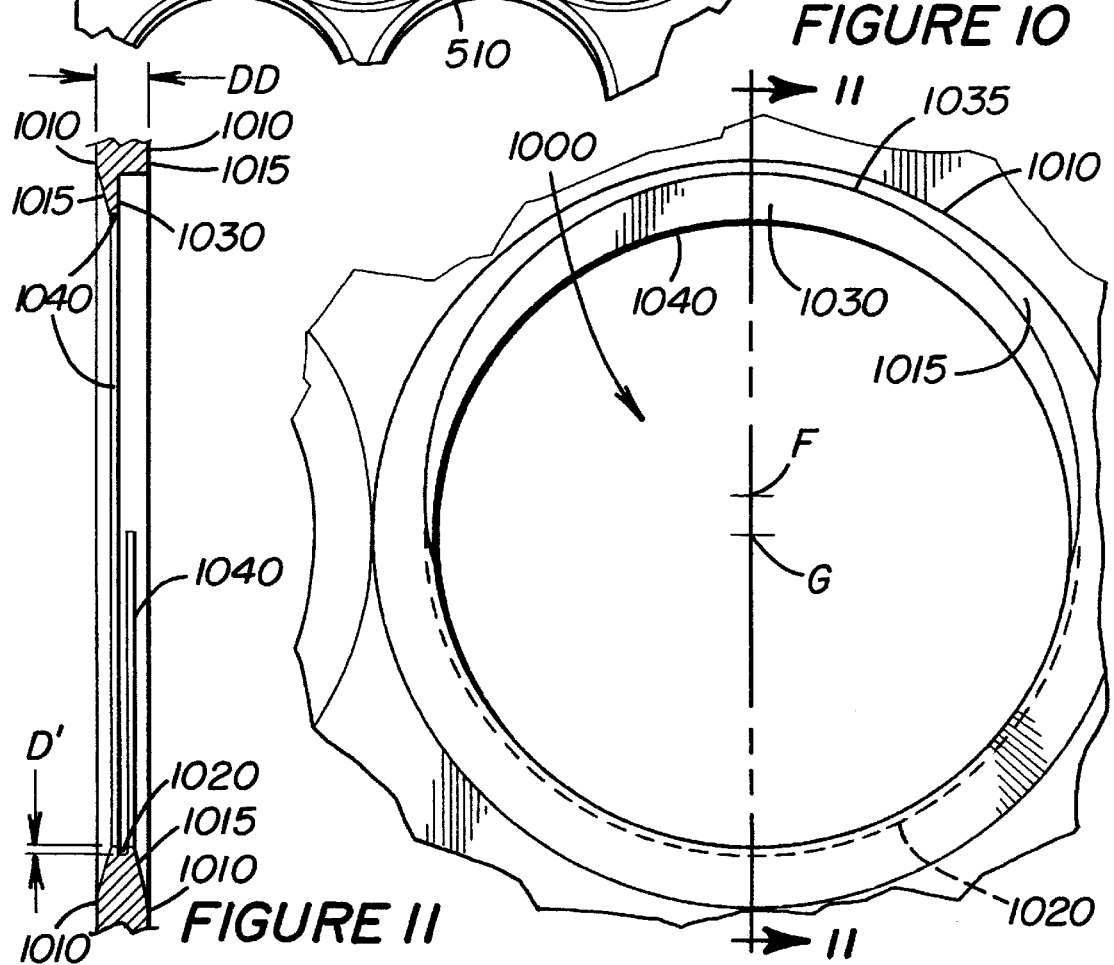
FIGURE 10
FIGURE 11

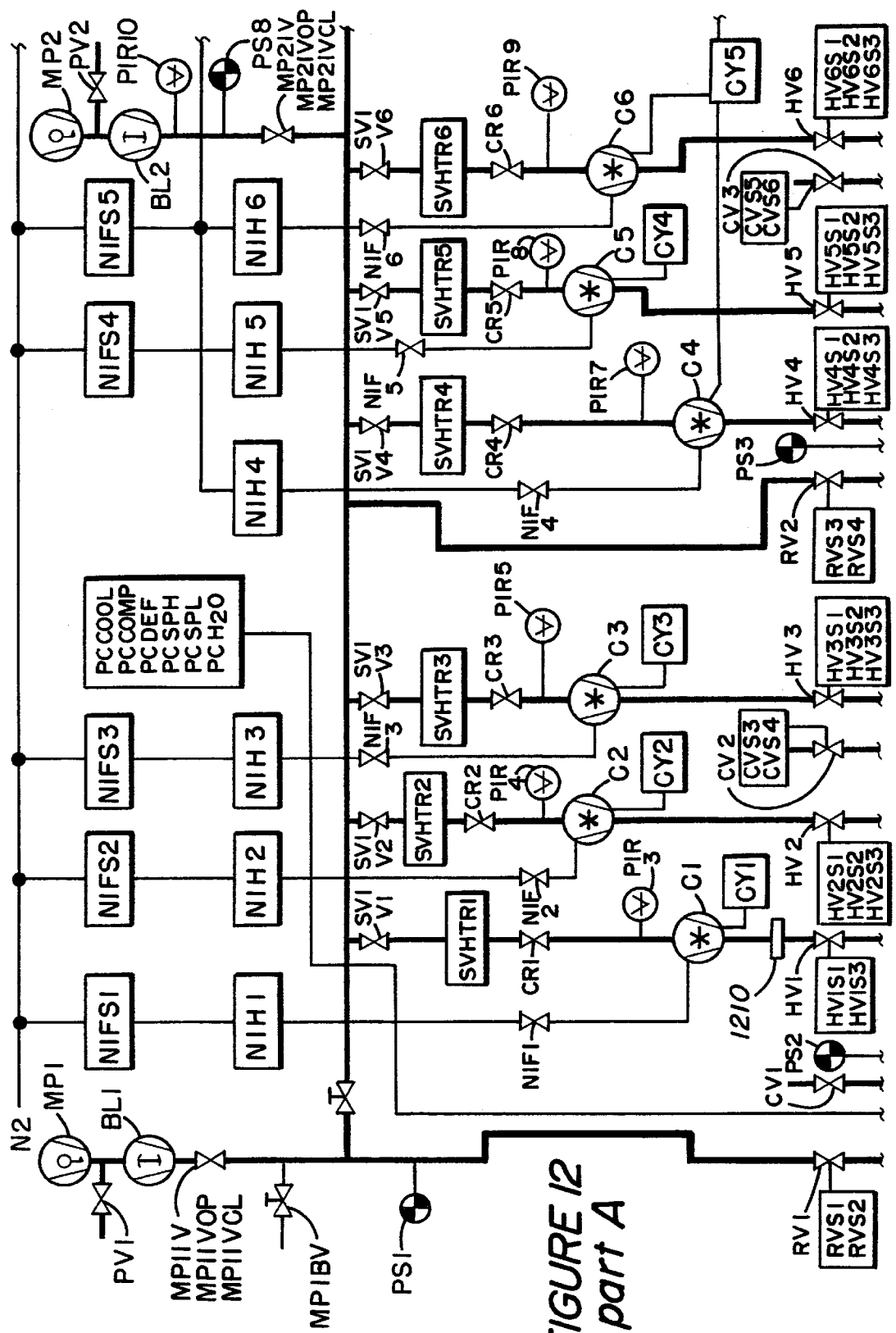
FIGURE 12 part A

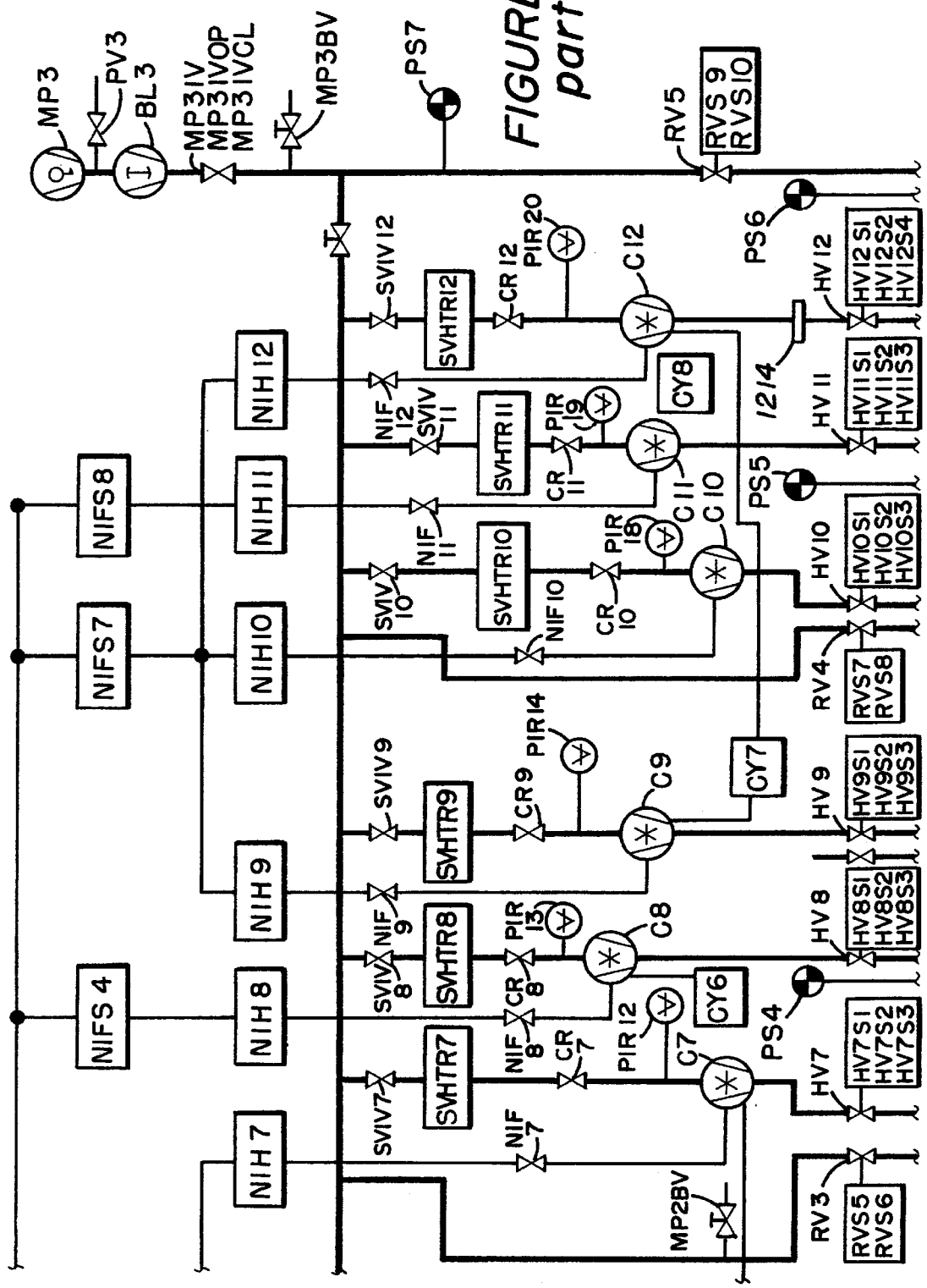

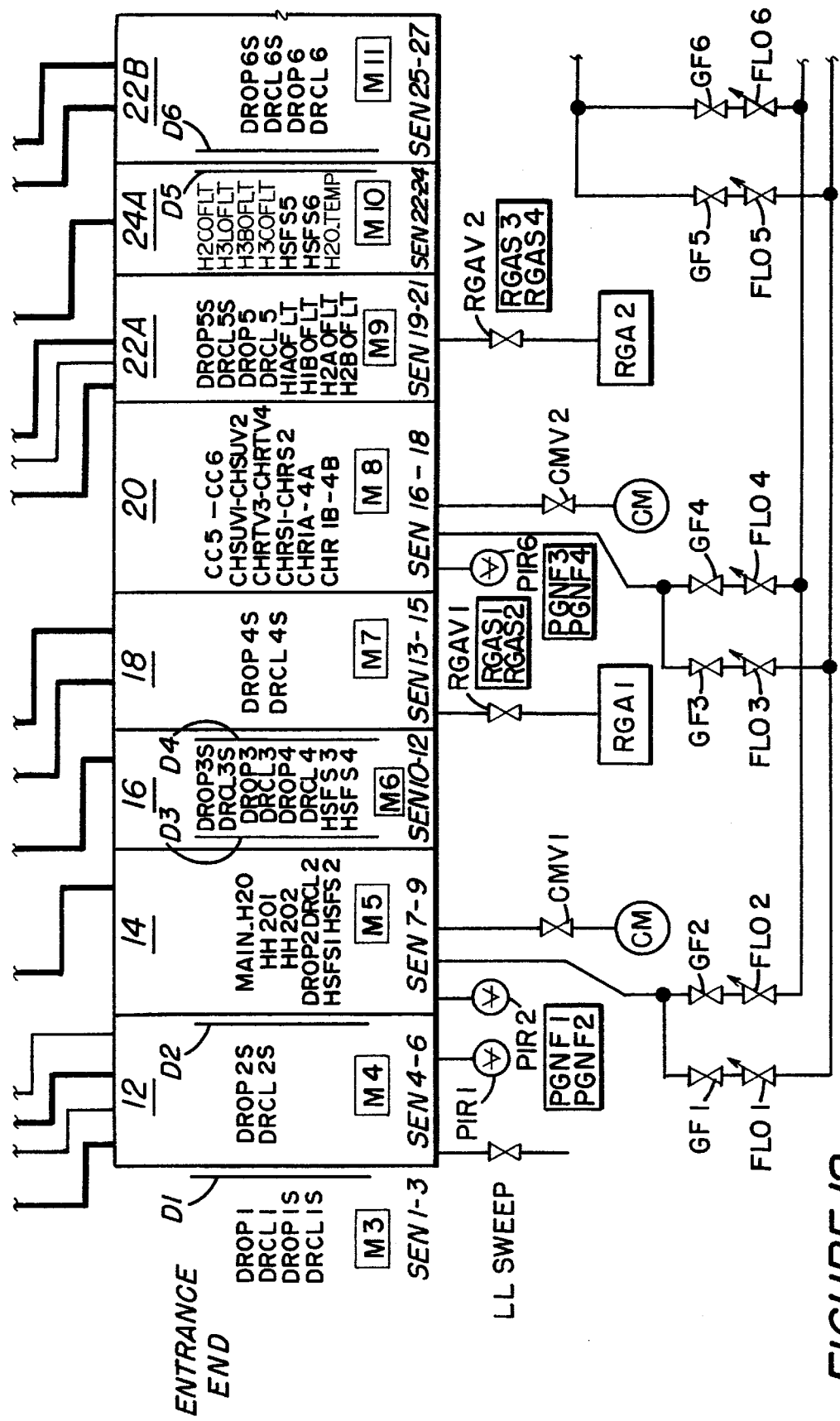
FIGURE 12 part C

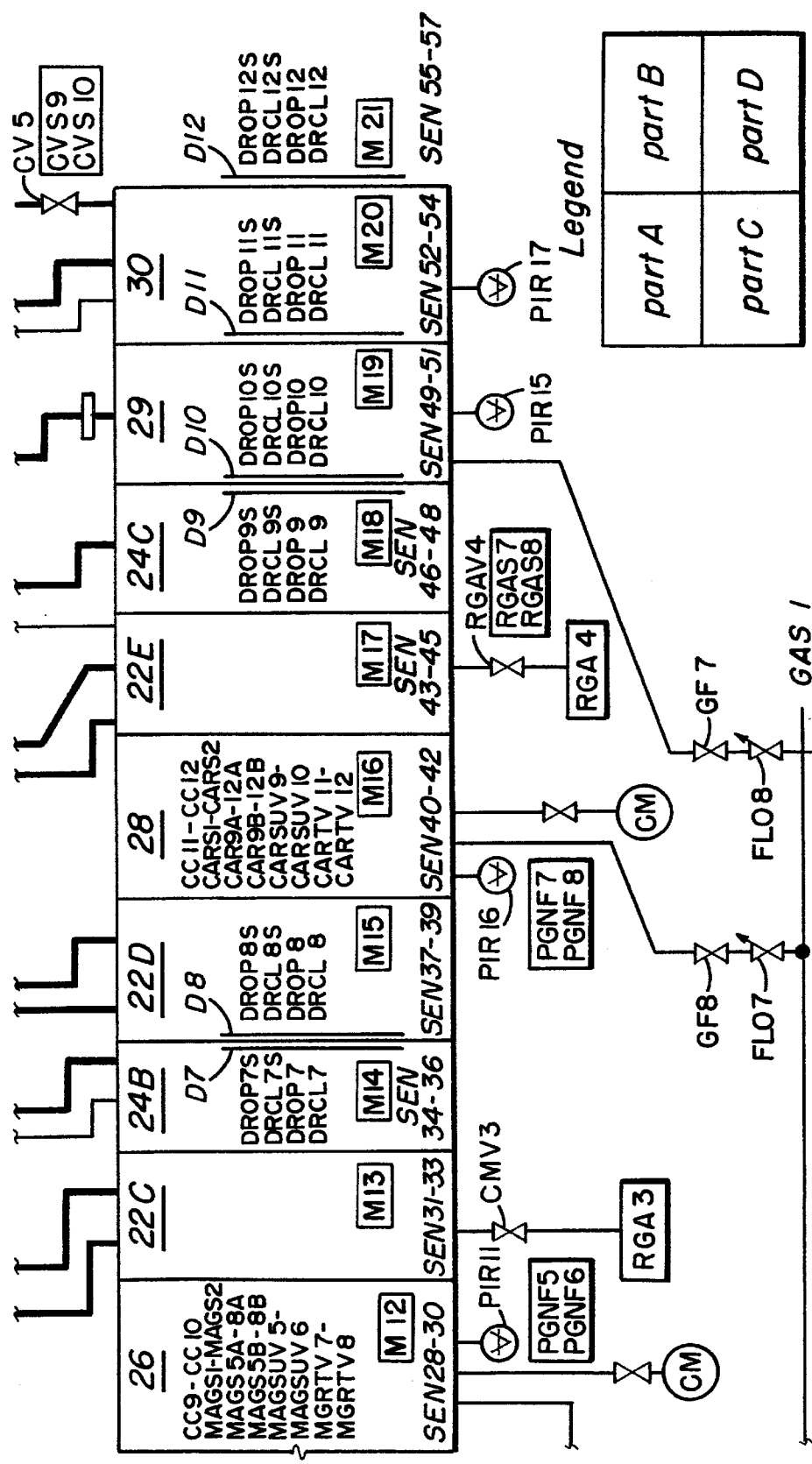
FIGURE 12 part D

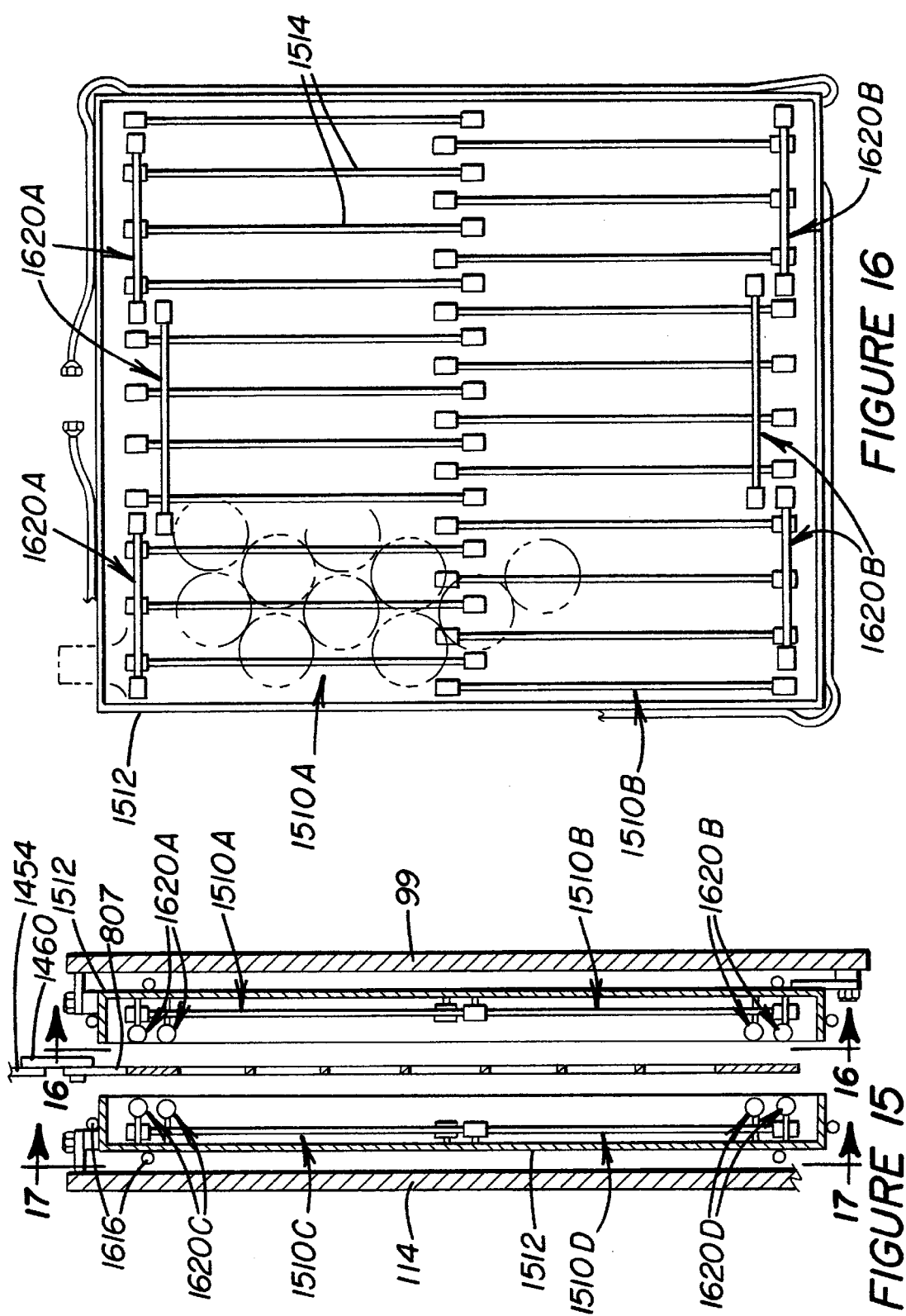

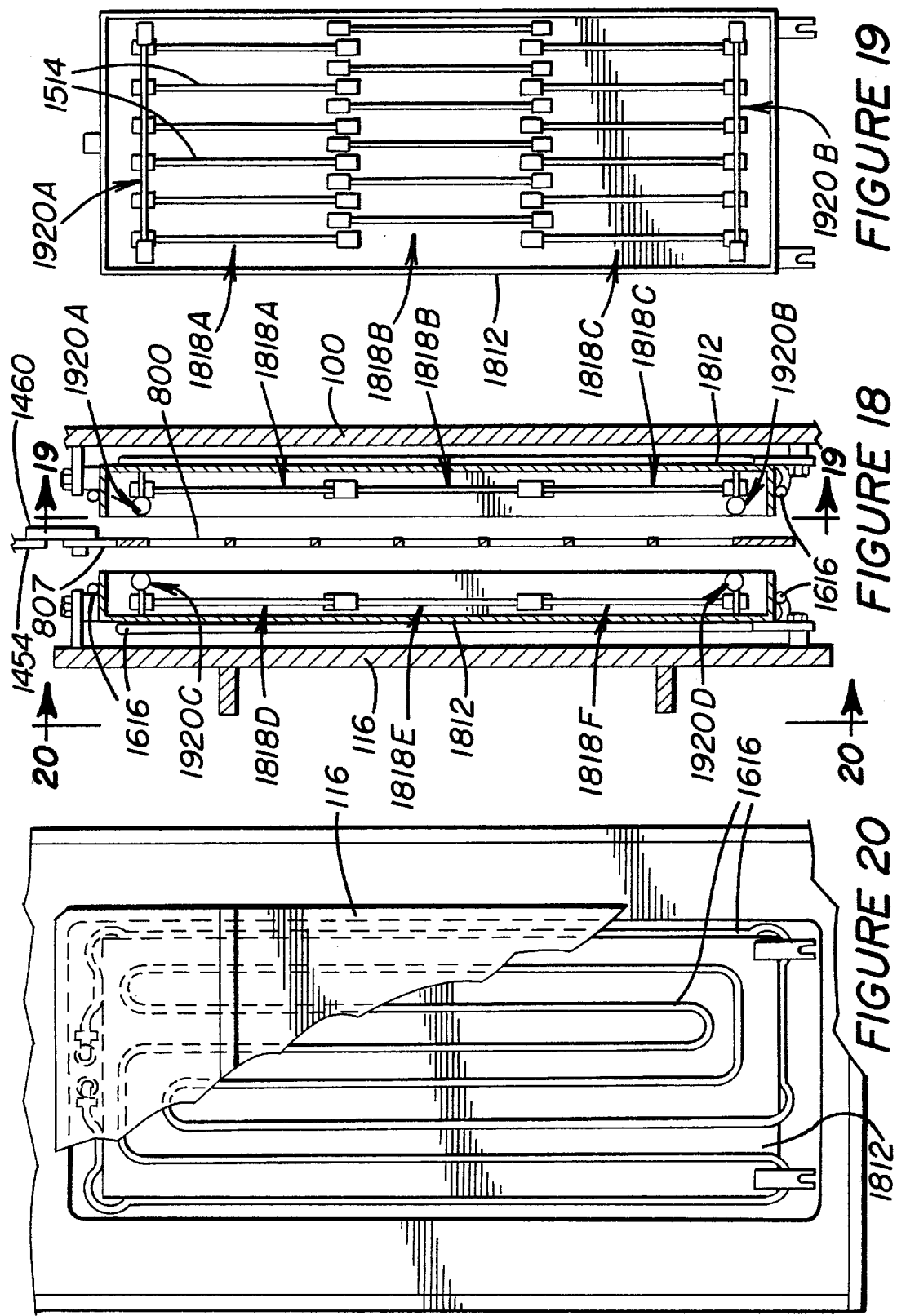

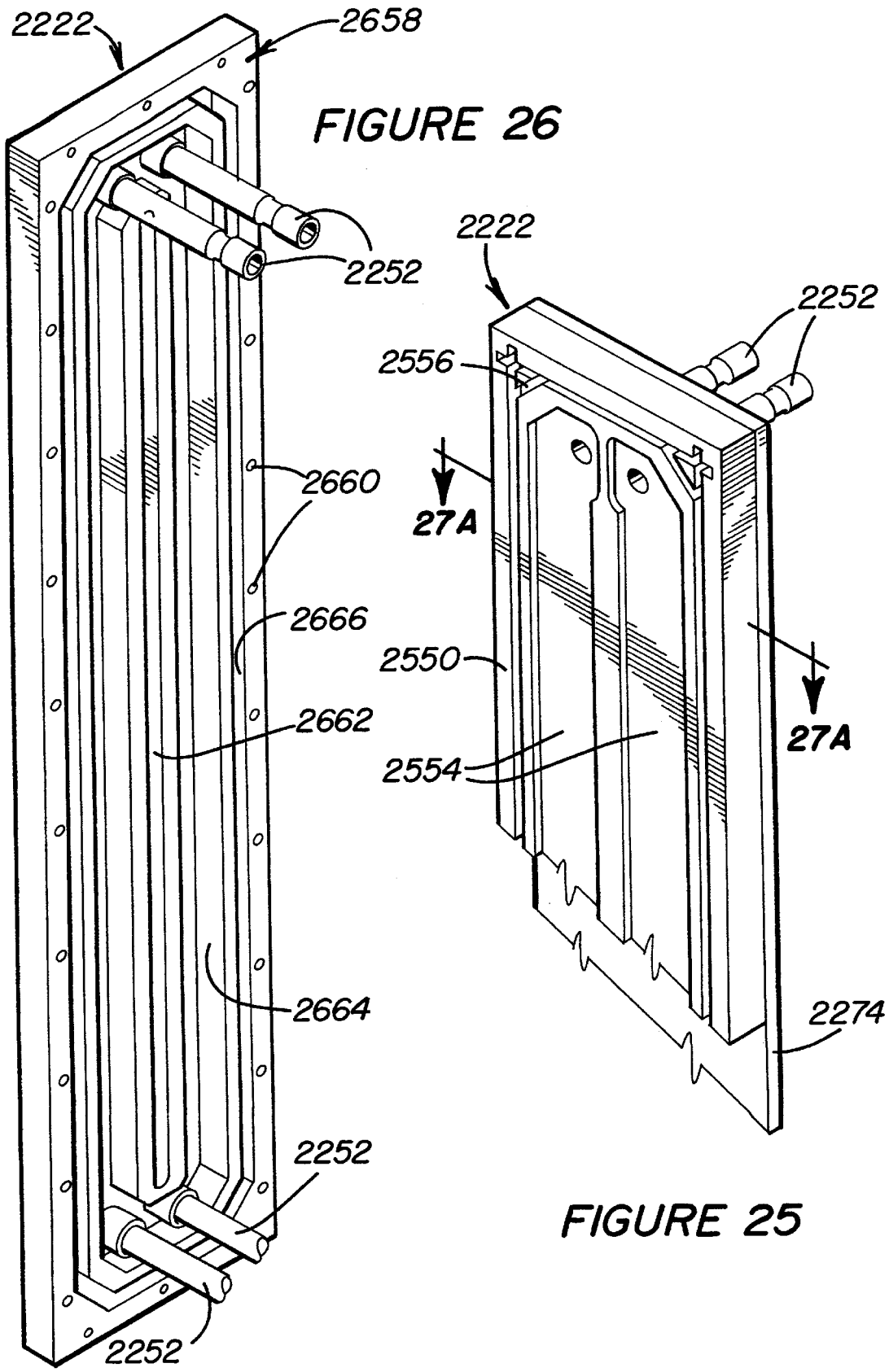

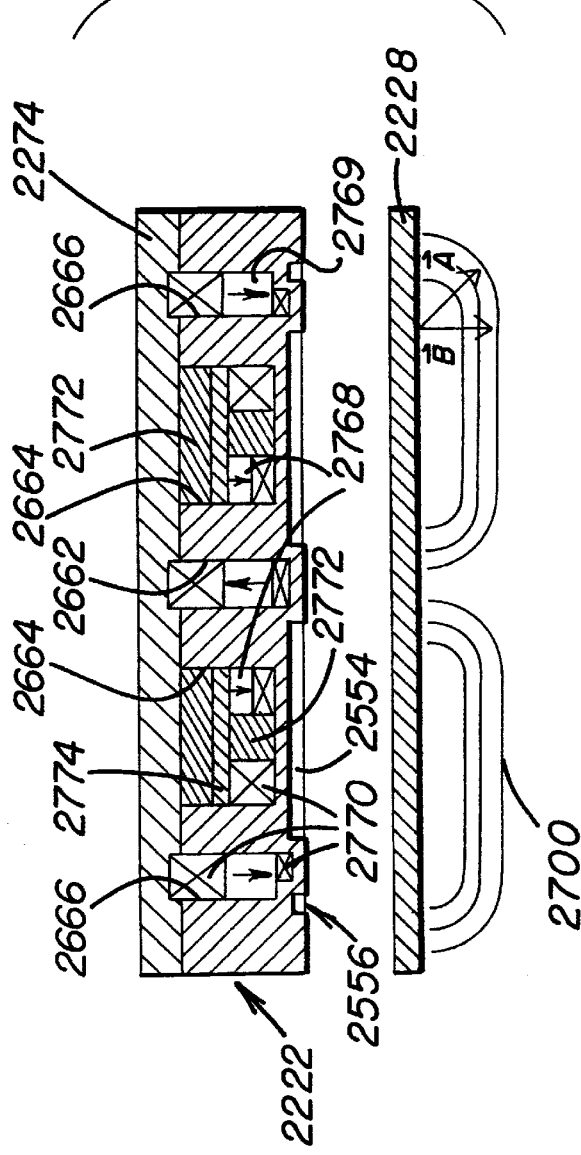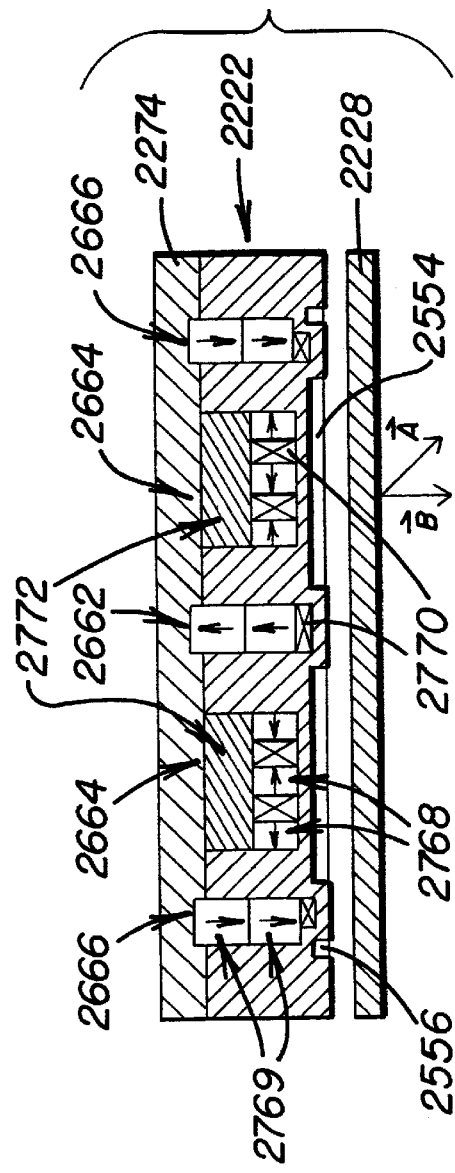

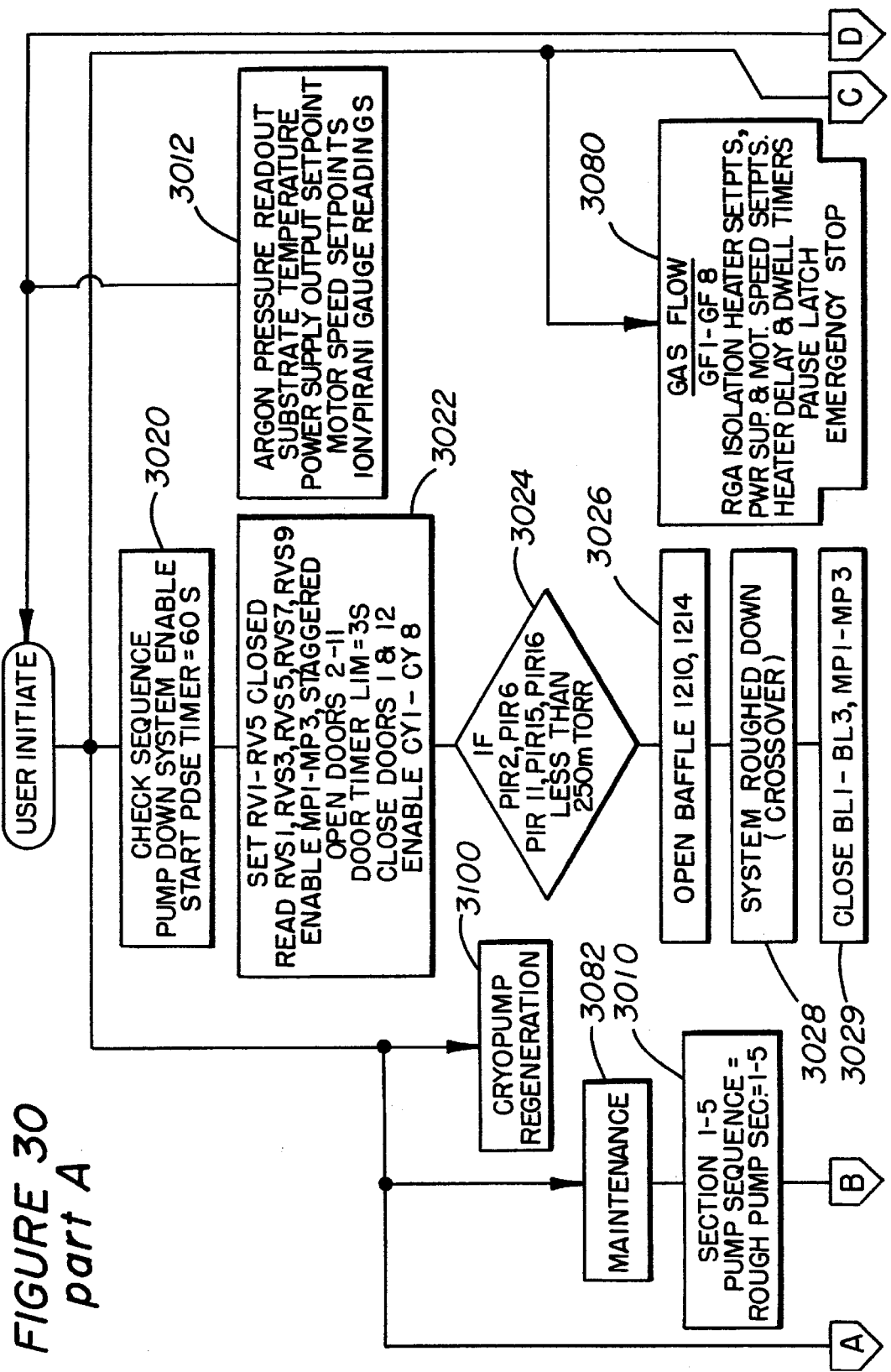
FIGURE 30 part A

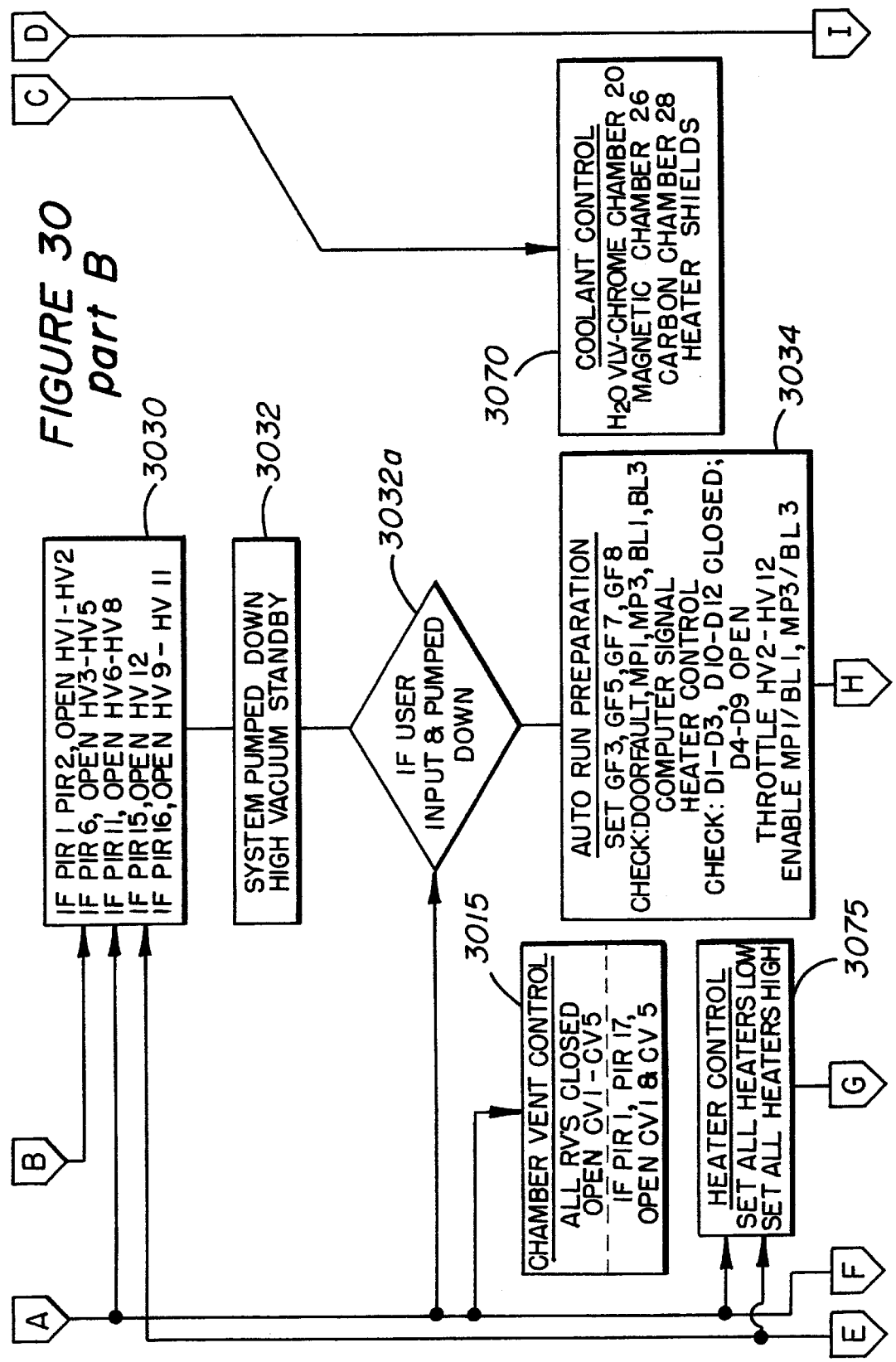

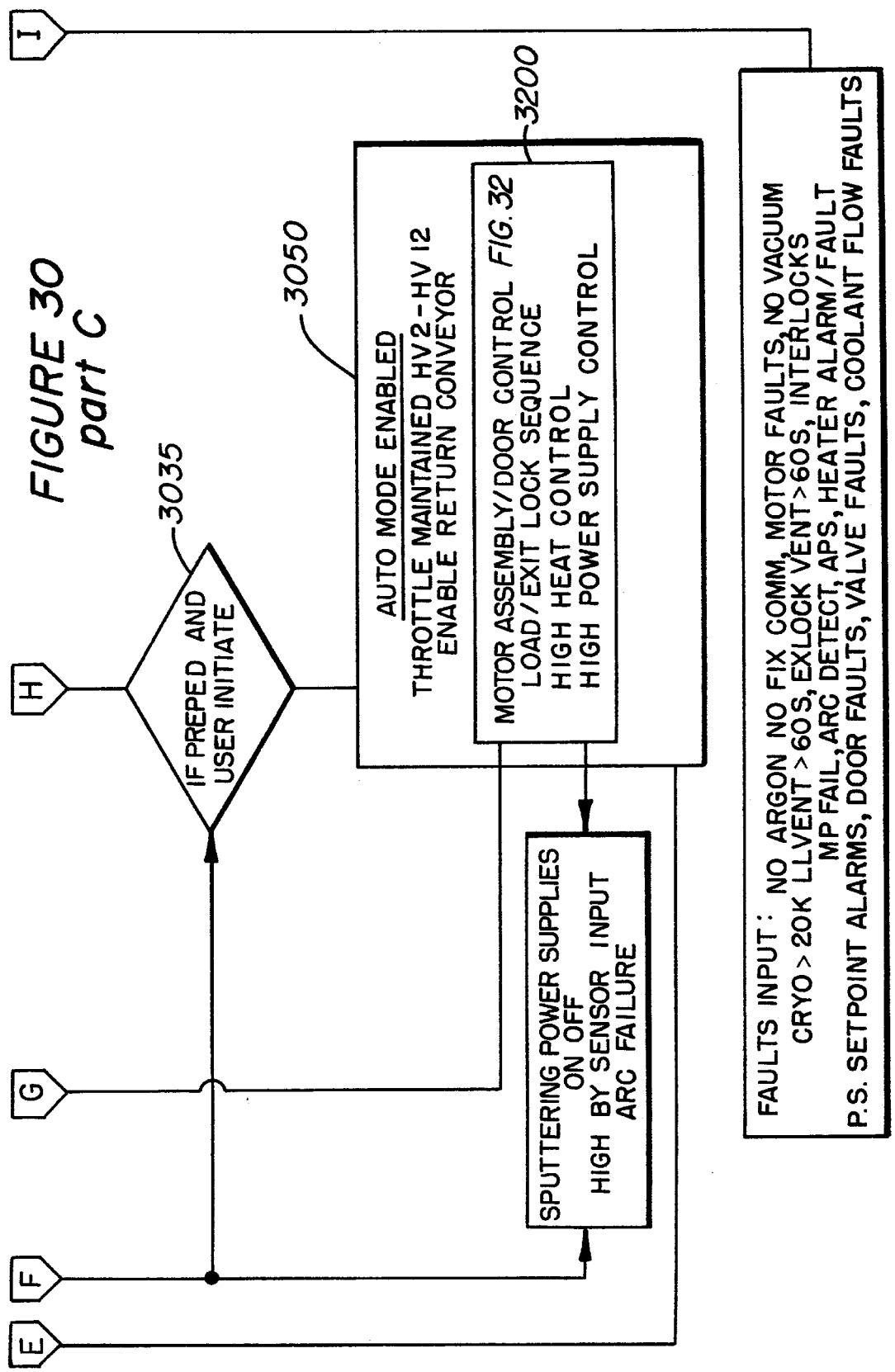

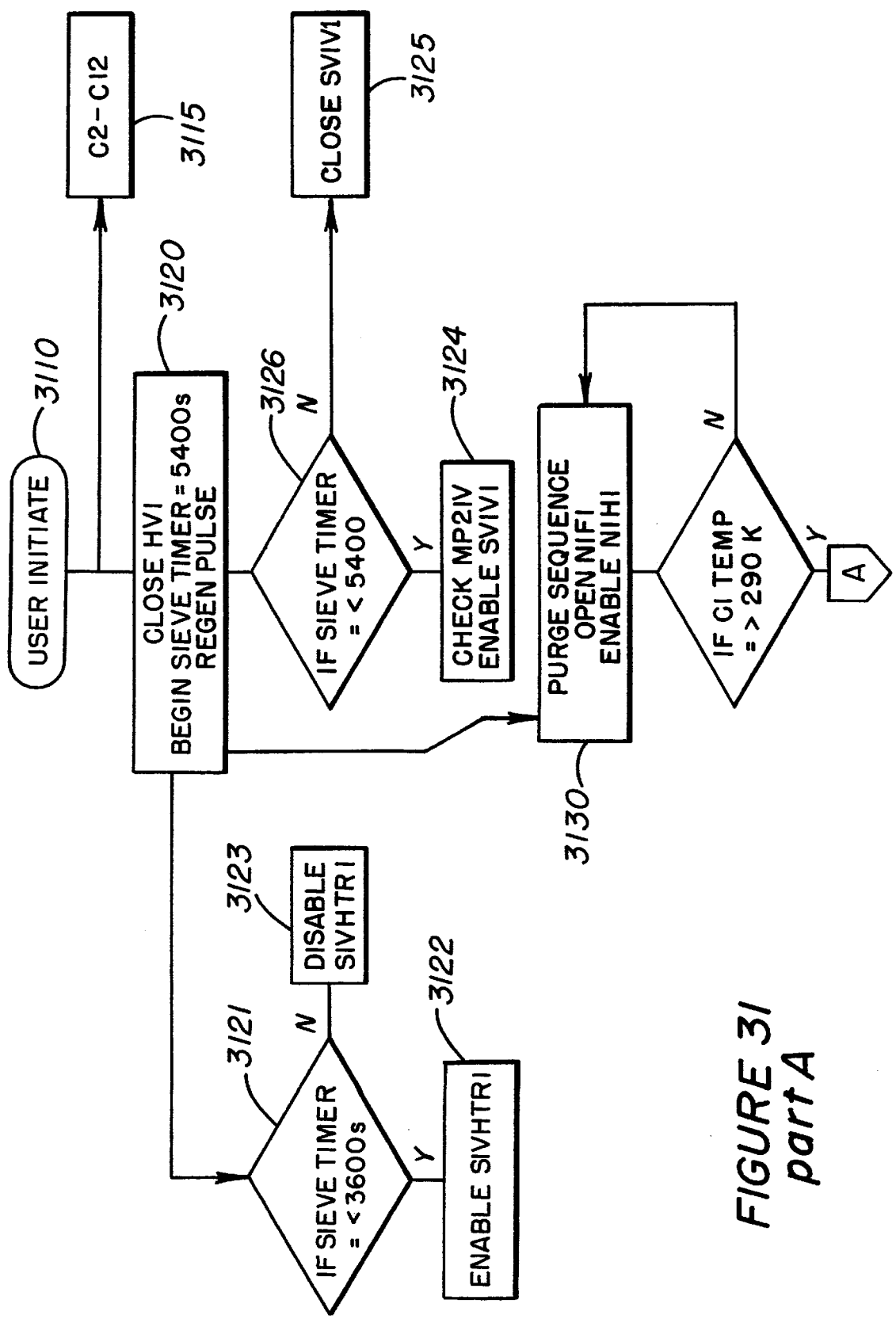
FIGURE 31 part A

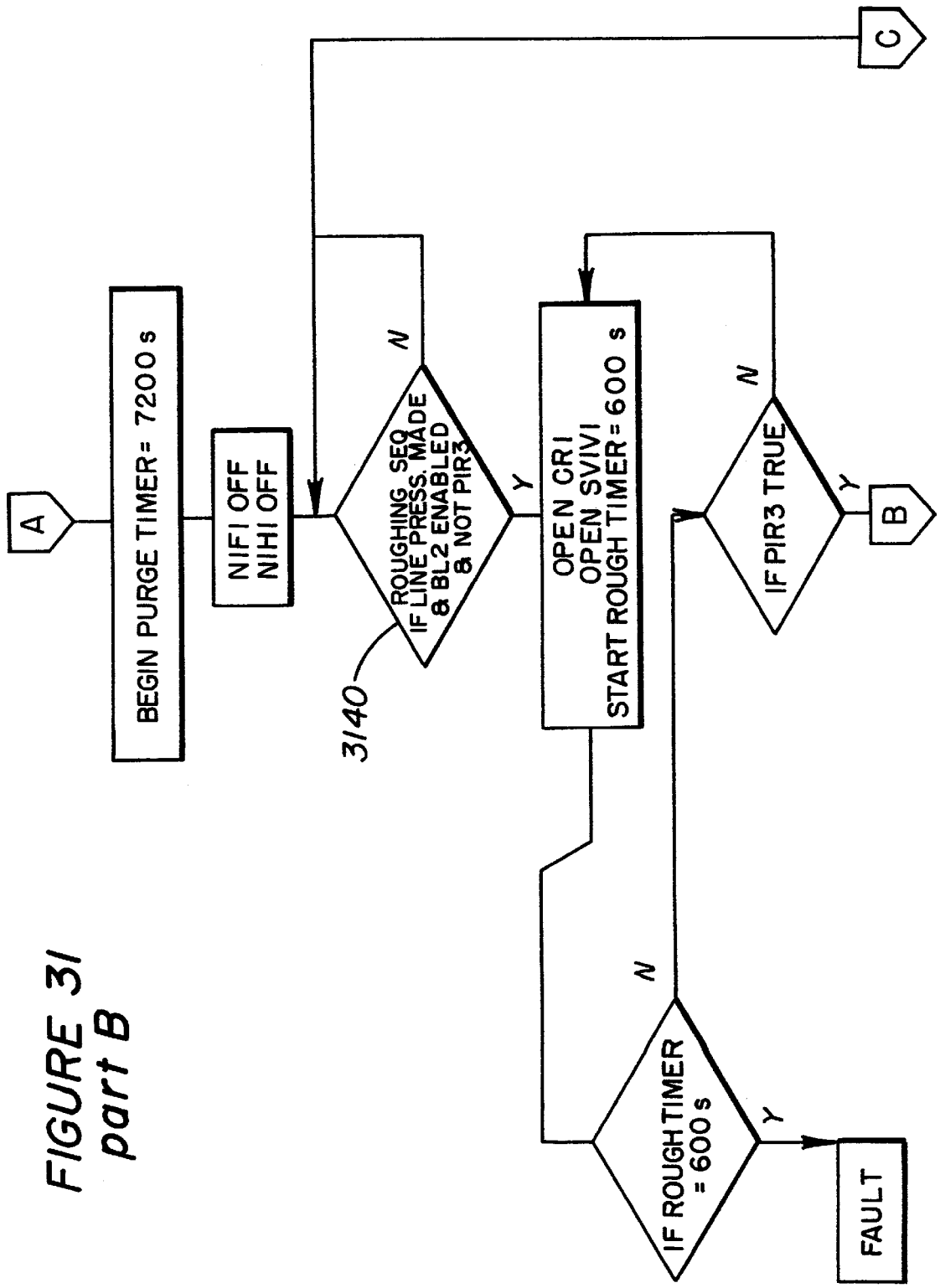
FIGURE 31 part B

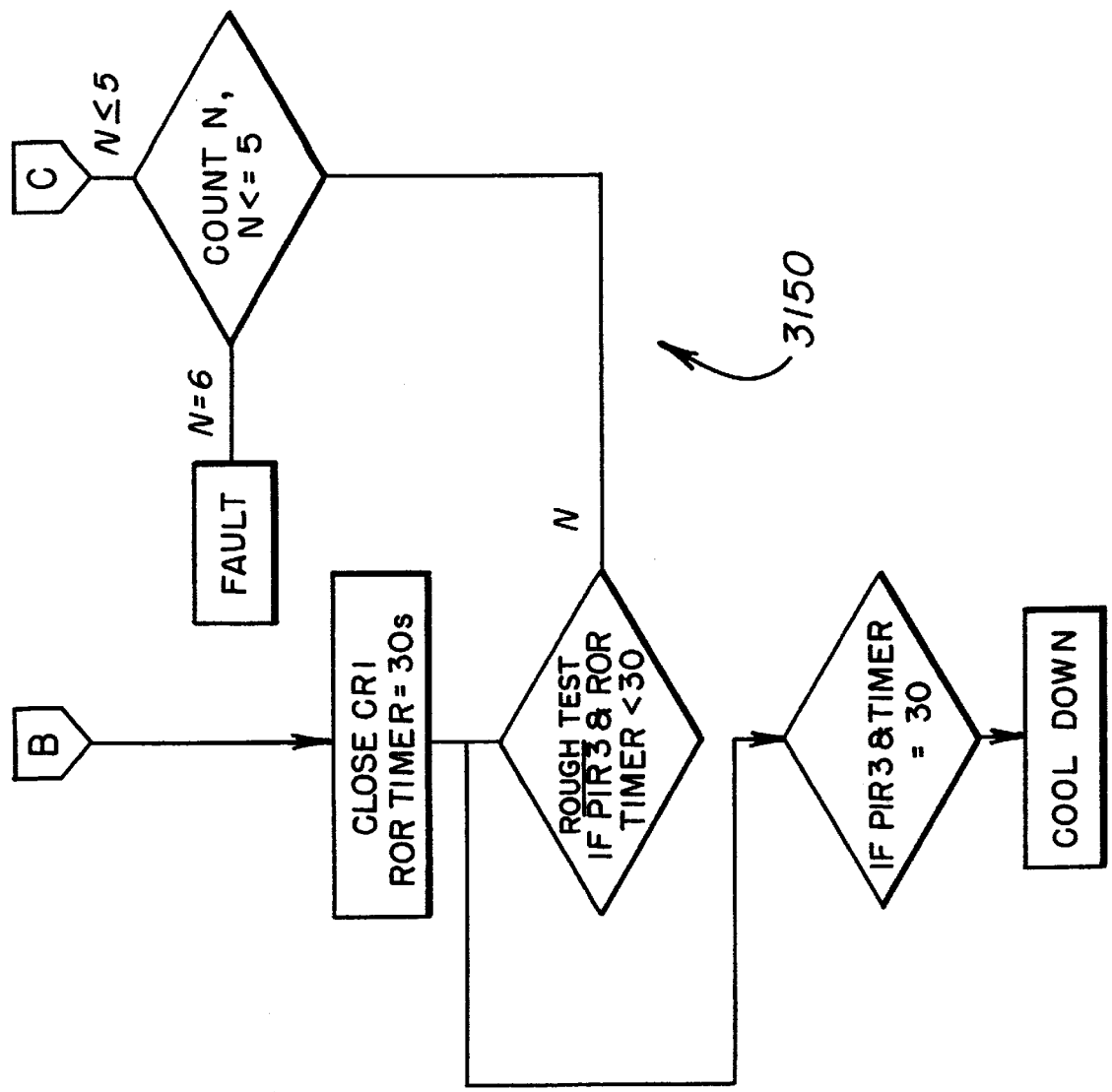
FIGURE 31 part C

HEATING SYSTEM FOR HIGH THROUGHPUT SPUTTERING

This application is a division of U.S. application Ser. No. 07/681,866 filed Apr. 4, 1991, now abandoned.

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

BACKGROUND OF THE INVENTION

1. Field of the Invention

The invention relates to an apparatus and method for depositing multilayer thin films in a magnetron sputtering process. More particularly, the invention relates to an apparatus and method for depositing thin magnetic films for magnetic recording media in a high volume, electronically controlled, magnetron sputtering process, and to production of an improved magnetic recording disk product thereby.

2. Description of the Related Art

Sputtering is a well-known technique for depositing uniform thin films on a particular substrate. Sputtering is performed in an evacuated chamber using an inert gas, typically argon, with one or more substrates remaining static during deposition, being rotated about the target (a "planetary" system) or being transported past the target (an "in-line" system).

Fundamentally, the technique involves bombarding the surface of a target material to be deposited as the film with electrostatically accelerated argon ions. Generally, electric fields are used to accelerate ions in the plasma gas, causing them to impinge on the target surface. As a result of momentum transfer, atoms and electrons are dislodged from the target surface in an area known as the erosion region. Target atoms deposit on the substrate, forming a film.

Typically, evacuation of the sputtering chamber is a two-stage process in order to avoid contaminant-circulating turbulence in the chamber. First, a throttled roughing stage slowly pumps down the chamber to a first pressure, such as about 50 microns. Then, high vacuum pumping occurs using turbo-, cryo- or diffusion pumps to evacuate the chamber to the highly evacuated base pressure (about $10^{-7}$ Torr) necessary to perform sputtering. Sputtering gas is subsequently provided in the evacuated chamber, backfilling to a pressure of about 2–10 microns.

The sputtering process is useful for depositing coatings from a plurality of target materials onto a variety of substrate materials, including glass, nickel-phosphorus plated aluminum disks, and ceramic materials. However, the relatively low sputtering rate achieved by the process solely relying on electrostatic forces (diode sputtering) may be impracticable for certain commercial applications where high volume processing is desired. Consequently, various magnet arrangements have been used to enhance the sputtering rate by trapping electrons close to the target surface, ionizing more argon, increasing the probability of impacting and dislodging target atoms and therefore the sputtering rate. In particular, an increased sputtering rate is achieved by manipulation of a magnetic field geometry in the region adjacent to the target surface. Sputter deposition performed in this manner is generally referred to as magnetron sputtering.

The magnetic field geometry may be optimized by adjusting the polarity and position of individual magnets used to generate magnetic fields with the goal of using the magnetic field flux paths to enhance the sputtering rate. For example, U.S. Pat. No. 4,166,018, issued Aug. 28, 1989 to J. S. Chapin and assigned to Airco, Inc., describes a planar direct current (d.c.) magnetron sputtering apparatus which uses a magnet configuration to generate arcuate magnetic flux paths (or lines) that confine zhe electrons and ions in a plasma region immediately adjacent to the target erosion region. A variety of magnet arrangements are suitable for this purpose, as long as one or more closed loop paths of magnetic flux is parallel to the cathode surface, e.g., concentric ovals or circles.

The role of the magnetic field is to trap moving electrons near the target. The field generates a force on the electrons, inducing the electrons to take a spiral path about the magnetic field lines. Such a spiral path is longer than a path along the field lines, thereby increasing the chance of the electron ionizing a plasma gas atom, typically argon. In addition, field lines also reduce electron repulsion away from a negatively biased target. As a result, a greater ion flux is created in the plasma region adjacent to the target with a correspondingly enhanced erosion of target atoms from an area which conforms to a shape approximating the inverse shape of the field lines. Thus, if the field above the target is configured in arcuate lines, the erosion region adjacent to the field lines conforms to a shallow track, leaving much of the target unavailable for sputtering.

Even lower target utilization is problematic for magnetic targets because magnetic field lines tend to be concentrated within, and just above, a magnetic target. With increasing erosion of the magnetic target during sputtering, the field strength above the erosion region increases as more field lines 'leak' out from the target, trapping more electrons and further intensifying the plasma close to the erosion region. Consequently, the erosion region is limited to a narrow valley.

In addition to achieving high film deposition rates, sputtering offers the ability to tailor film properties to a considerable extent by making minor adjustments to process parameters. Of particular interest are processes yielding films with specific crystalline microstructures and magnetic properties. Consequently, much research has been conducted on the effects of sputtering pressures, deposition temperature and maintenance of the evacuated environment to avoid contamination or degradation of the substrate surface before film deposition.

Alloys of cobalt, nickel and chromium deposited on a chromium underlayer (CoNiCr/Cr) are highly desirable as films for magnetic recording media such as disks utilized in Winchester-type hard disk drives. However, on disk substrates, in-line sputtering processes create magnetic anisotropies which are manifested as signal waveform modulations and anomalies in the deposited films.

Anisotropy in the direction of disk travel through such in-line processes is understood to be caused by crystalline growth perpendicular to the direction of disk travel as a result of the deposition of the obliquely incident flux of target atoms as the disk enters and exits a sputtering chamber. Since magnetic film properties depend on crystalline microstructure, such anisotropy in the chromium underlayer can disrupt the subsequent deposition of the magnetic CoNiCr layer in the preferred orientation. The preferred crystalline orientation for the chromium underlayer is with the closely packed, bcc {110} plane parallel to the film surface. This orientation for the chromium nucleating layer forces the 'C' axis of the hcp structure of the magnetic cobalt-alloy layer, i.e., the easy axis of magnetization, to be aligned in the film plane. Similarly, the orientation of the magnetic field generated in the sputtering process may induce an additional anisotropy which causes similar signal waveform modulations. See, Uchinami, et al., "Magnetic Anisotropies in Sputtered Thin Film Disks", *IEEE Trans. Magn.*, Vol. MAG-23, No. 5, 3408–10, September 1987, and Hill, et al., "Effects of Process Parameters on Low Frequency Modulation on Sputtered Disks for Longitudinal Recording", *J. Vac Sci. Tech.*, Vol. A4, No. 3, 547–9, May 1986 (describing magnetic anisotropy phenomena).

Several approaches have been taken to eliminate the aforementioned waveform modulation problems while enhancing magnetic properties in the coating, especially coercivity. For instance, U.S. Pat. No. 4,816,127, issued Mar. 28, 1989 to A. Eltoukhy and assigned to Xidex Corp., describes one means for shielding the substrate to intercept the obliquely incident target atoms. In addition, Teng, et al., "Anisotropy-Induced Signal Waveform Modulation of DC Magnetron Sputtered Thin Films", *IEEE Trans. Magn.*, Vol. MAG-22, 579–581, 1986, and Simpson, et al., "Effect of Circumferential Texture on the Properties of Thin Film Rigid Recording Disks", *IEEE Trans. Magn.*, Vol. MAG-23, No. 5, 3405–7, September 1987, suggest texturizing the disk substrate surface prior to film deposition. In particular, the authors propose circumferential surface grooves to promote circumferentially oriented grain growth and thereby increase film coercivity.

Other approaches to tailoring film properties have focused on manipulating the crystalline microstructure by introducing other elements into the alloy composition. For example, Shiroishi, et al., "Read and Write Characteristics of Co-Alloy/Cr Thin Films for Longitudinal Recording", *IEEE Trans. Magn.*, Vol. MAG-24, 2730–2, 1988, and U.S. Pat. No. 4,652,499, issued Mar. 24, 1987 to J. K. Howard and assigned to IBM, relate to the substitution of elements such as platinum (Pt), tantalum (Ta), and zirconium (Zr) into cobalt-chromium (CoCr) films to produce higher coercivity and higher corrosion resistance in magnetic recording films.

CoCr alloys with tantalum (CoCrTa) are particularly attractive films for magnetic recording media. For example, it is known in the prior art to produce CoCrTa films by planetary magnetron sputtering processes using individual cobalt, chromium and tantalum targets or using cobalt-chromium and tantalum targets.

Fisher, et al., "Magnetic Properties and Longitudinal Recording Performance of Corrosion Resistant Alloy Films", *IEEE Trans. Magn.*, Vol. MAG 22, no. 5, 352–4, September 1986, describe a study of the magnetic and corrosion resistance properties of sputtered CoCr alloy films. Substitution of 2 atomic percent (at. %) Ta for Cr in a Co-16 at. % Cr alloy (i.e., creating a Co-14 at. % Cr-2 at. % Ta alloy) was found to improve coercivity without increasing the saturation magnetization. In particular, a coercivity of 1400 Oe was induced in a 400 Å film. In addition, linear bit densities from 8386 flux reversals/cm to 1063 flux reversals/cm (21300 fci to 28100 fci) were achieved at −3 dB, with a signal-to-noise (SNR) ratio of 30 dB. Moreover, corrosion resistance of CoCr and CoCrTa films was improved relative to CoNi films.

U.S. Pat. No. 4,940,548, issued on Aug. 21, 1990 to Furusawa, et al., and assigned to Hitachi, Ltd., discloses the use of Ta to increase the coercivity and corrosion resistance of CoCr (and CoNi) alloys. CoCr alloys with 10 at. % Ta (and chromium content between 5 and 25 at. %) were sputtered onto multiple layers of chromium to produce magnetic films with low modulation even without texturing the substrate surface and highly desirable crystalline microstructure and magnetic anisotropy.

Development of a high throughput in-line system to produce sputtered CoCrTa films with enhanced magnetic and corrosion-resistance properties for the magnetic recording media industry has obvious economic advantages.

Linear recording density of magnetic films on media used in Winchester-type hard disk drives is known to be enhanced by decreasing the flying height of the magnetic recording head above the recording medium. With reduced flying height, there is an increased need to protect the magnetic film layer from wear. Magnetic films are also susceptible to corrosion from vapors present even at trace concentrations within the magnetic recording system. A variety of films have been employed as protective overlayers for magnetic films, including rhodium, carbon and inorganic nonmetallic carbides, nitrides and oxides, like silica or alumina. However, problems such as poor adhesion to the magnetic layer and inadequate wear resistance have limited the applicability of these films. U.S. Pat. No. 4,503,125 issued on Mar. 3, 1985 to Nelson, et al. and assigned to Xebec, Inc. describes a protective carbon overcoating for magnetic films where adhesion is enhanced by chemically bonding a sputtered layer of titanium between the magnetic layer and the carbon overcoating.

In the particular case of sputtered carbon, desirable film properties have been achieved by carefully controlling deposition parameters. For example, during the sputtering process, the amount of gas incorporated in the growing film depends on sputtering parameters like target composition, sputtering gas pressure and chamber geometry. U.S. Pat. No. 4,839,244, issued on Jun. 13, 1989 to Y. Tsukamoto and assigned to NEC Corp., describes a process for co-sputtering a protective graphite fluoride overlayer with an inorganic nonmetallic compound in a gaseous atmosphere which includes fluorine gas. U.S. Pat. No. 4,891,114 issued on Jan. 1, 1990 to Hitzfeld, et al., and assigned to BASF Aktiengesellschaft of Germany, relates to a d. c. magnetron sputtering process for an amorphous carbon protective layer using a graphitic carbon target.

As the wear-resistant layer for magnetic recording media, it is desirable that the carbon overlayer have a microcrystalline structure corresponding to high hardness. In other words, it is desirable during sputtering to minimize graphitization of carbon which softens amorphous carbon films. One means employed to moderate graphitization of sputtered carbon films is by incorporating hydrogen into the film. Such incorporation may be accomplished by sputtering in an argon atmosphere mixed with hydrogen or a hydrogen-containing gas, such as methane or other hydrocarbons.

Magnetron sputtering processes have been developed which have been somewhat successful in achieving high throughput. For example, U.S. Pat. Nos. 4,735,840 and 4,894,133 issued to Hedgcoth on Apr. 5, 1988 and Apr. 16, 1990, respectively, describe a high volume planar d. c. magnetron in-line sputtering apparatus which forms multi-layer magnetic recording films on disks for use in Winchester-type hard disk technology. The apparatus includes several consecutive regions for sputtering individual layers within a single sputtering chamber through which preheated disk substrates mounted on a pallet or other vertical carrier proceed at velocities up to about 10 mm/sec (1.97 ft/min), though averaging only about 3 mm/sec (0.6 ft/min). The first sputtering region deposits chromium (1,000 to 5,000 Å) on a circumferentially textured disk substrate. The next region deposits a layer (200 to 1,500 Å) of a magnetic alloy such as CoNi. Finally, a protective layer (200 to 800 Å) of a wear- and corrosion-resistant material such as amorphous carbon is deposited.

The apparatus is evacuated by mechanical and cryo pumps to a base pressure about $2 \times 10^{-7}$ Torr. Sputtering is performed at a relatively high argon pressure between 2 and $4 \times 10^2$ Torr (20 to 40 microns) to eliminate anisotropy due to obliquely incident flux.

In optimizing a sputtering process to achieve high throughput, consideration should be given to other time-influenced aspects of the process apart from the sputtering rate. For example, substrate heating is typically accomplished with heaters requiring an extended dwell time to warm substrates to a desired equilibrium temperature. In addition, substrate transport speeds through the sputtering apparatus have been limited with respect to mechanisms using traditional bottom drive, gear/belt-driven transport systems. Such bottom drive systems generally have intermeshing gears and may be practically incapable of proceeding faster than a particular rate due to rough section-to-section transitions which may dislodge substrates from the carrier and/or create particulate matter from gear wear which contaminates the disks prior to or during the sputtering process. Thus, overall process throughput would be further enhanced by the employment of heating and transport elements which require minimal time to perform these functions.

Generally, prior art sputtering devices utilize relatively unsophisticated means for controlling the sputtering processes described therein. Such control systems may comprise standard optical or electrical metering monitored by a system operator, with direct electrical or electro-mechanical switching of components utilized in the system by the system operator. Such systems have been adequately successful for limited throughput of sputtered substrates. However, a more comprehensive system is required for higher throughput sputtering operations. Specifically, a control system is required which provides to the operator an extensive amount of information concerning the ongoing process through a relatively user-friendly environment. In addition, the control system must adequately automate functions both in series and in parallel where necessary to control every aspect of the sputtering system. Further, it is desirable to include within such a control system the capability to preset a whole series of operating parameters to facilitate rapid set-up of the system for processes employing myriad sputtering conditions.

SUMMARY OF THE INVENTION

Thus, an object of the present invention is to provide a high throughput sputtering process and apparatus.

A further object of the present invention is to provide a control system for the apparatus and process which continuously monitors and facilitates alteration of film deposition process parameters.

A further object of the present invention is to provide a high throughput sputtering apparatus with a centralized electronic control system.

An additional object of this invention is to provide the above objects in a means by which sputtering is achieved in a highly efficient, contaminant-free environment.

An additional object of this invention is to provide a highly versatile, contaminant-free means for transporting substrates through the apparatus and process.

A further object of this invention is to transport substrates through the sputtering apparatus by means of an overhead, gearless transport mechanism.

A further object of this invention is to provide a transport mechanism for carrying a plurality of substrates, each at a user-defined, variable speed.

A further object of this invention is to maintain a contaminant-free environment within the sputtering apparatus by means of a high speed, high capacity vacuum pump system.

A further object of this invention is to provide a magnetron design allowing efficient erosion of target material during the sputtering process.

A further object of this invention is to provide a high throughput sputtering apparatus which achieves and maintains a uniform substrate surface temperature profile before film deposition.

A further object of this invention is to provide a highly isotropic film by minimizing deposition by target atoms impinging on the substrate surface at high angles of incidence.

A further object of this invention is to provide high throughput sputtering apparatus which minimizes oxidation of the chromium underlayer before magnetic film deposition.

An additional object of the present invention is to provide high quality thin magnetic films on magnetic recording media with superior magnetic recording properties.

A further object of this invention is to provide high quality thin cobalt-chromium-tantalum (CoCrTa) films with superior magnetic recording properties.

A further object of this invention is to provide high quality sputtered thin magnetic films circumferentially oriented along the easy magnetic axis.

A further object of this invention is to provide high throughput sputtering apparatus for high quality thin carbon films with superior wear, hardness, corrosion and elastic properties.

A further object of this invention is to provide a method for depositing wear-resistant carbon films comprising sputtering in the presence of a hydrogen-containing gas.

A further object of this invention is to provide an improved method for sputtering carbon films using either an electrically biased or grounded pallet.

These and other objects of the invention are accomplished in a high throughput sputtering apparatus and process capable of producing sputtered substrates at a rate of up to five times greater than the prior art. An apparatus in accordance with the present invention provides a single or multilayer coating to the surface of a plurality of substrates. Said apparatus includes a plurality of buffer and sputtering chambers, and an input end and an output end, wherein said substrates are transported through said chambers of said apparatus at varying rates of speed such that the rate of speed of a pallet from said input end to said output end is a constant for each of said plurality of pallets. A high throughput sputtering apparatus having a plurality of integrally matched components in accordance with the present invention may comprise means for sputtering a multi-layer coating onto a plurality of substrates, said means for sputtering including a series of sputtering chambers each having relative isolation from adjacent chambers to reduce cross contamination between the coating components being sputtered onto substrates therein, said sputtering chambers being isolated from ambient atmospheric conditions; means for transporting said plurality of substrates through said means for sputtering at variable velocities; means for reducing the ambient pressure within said means for sputtering to a vacuum level within a pressure range sufficient to enable sputtering operation; means for heating said plurality of substrates to a temperature conducive to sputtering said multi-layer coatings thereon, said means for heating providing a substantially uniform temperature profile over the surface of said substrate; and control means for providing control signals to and for receiving feedback input from, said means for sputtering, means for transporting, means for reducing and means for heating, said control means being programmable for allowing control over said means for sputtering, means for transporting, means for reducing and means for heating.

A process in accordance the present invention includes: providing substrates to be sputtered; creating an environment about said substrates, said environment having a pressure within a pressure range which would enable sputtering operations; providing a gas into said environment in a plasma state and within said pressure range to carry out sputtering operations; transporting substrates at varying velocities through said environment a sequence of sputtering steps within said environment and along a return path external to said environment simultaneously introducing the substrates into said environment without substantially disrupting said pressure of said environment, providing rapid and uniform heating of said substrates to optimize film integrity during sputtering steps, and sputtering said substrates to provide successive layers of thin films on the substrates; and, removing the sputtered substrates without contaminating said environment.

BRIEF DESCRIPTION OF THE DRAWINGS

The invention will be better understood by reference to the figures of the drawings wherein like numbers denote like parts throughout and wherein:

FIG. 5 is a simplified perspective view of the means for texturing disk substrates used in the process of the present invention.

FIG. 7 is a sectional magnified view of the texturing of a disk surface provided by the means for texturing disclosed in FIG. 5.

FIG. 9 is a partial, enlarged view of the pallet of FIG. 8.

FIG. 10 is a partial, enlarged view of one region for carrying a disk in the pallet of FIG. 9.

FIG. 11 is a cross sectional view along 11—11 of the disk carrying region shown in FIG. 10.

FIG. 12 is an overview diagram of the pumping system used with the apparatus of the present invention.

FIG. 15 is a cross sectional view of the main (or "dwell") heating lamp assembly and chamber.

FIG. 16 is a view of the main heating lamp assembly along line 16—16 in FIG. 15.

FIG. 18 is a cross sectional view of the secondary (or "passby") heating lamp and chamber assembly.

FIG. 19 is a view of the heating lamp assembly along line 19—19 in FIG. 18.

FIG. 20 is a view of the secondary heating lamp, mounting tray and cooling lines along line 20—20 in FIG. 18.

FIG. 25 is a partial perspective view of a first surface of the cathode portion of the magnetron of the present invention.

FIG. 26 is a perspective view of a second surface of the cathode of the magnetron of the present invention, including cooling line inputs and magnet channels of the cathode.

FIG. 27A is a cross-sectional, assembled view of a first embodiment of the magnet configuration in the cathode for a nonmagnetic target of the present invention along line 27—27 of FIG. 25.

FIG. 27B is a cross-sectional, assembled views of a second embodiment of the magnet configuration in the cathode for magnetic target of the present invention along line 27—27 of FIG. 25.

FIG. 30 is a block flow chart of functional aspects of the software utilized in the process controller(s) of the present invention.

FIG. 31 is a flow chart of the automated cryogenic pump regeneration process of the present invention.

DESCRIPTION OF THE PREFERRED EMBODIMENT

A. Introduction

Described herein is an apparatus and method for applying multilayer thin films to a substrate. The apparatus of the present invention is capable of applying the multilayer coatings to any given substrate within a time frame of approximately five minutes. The apparatus and process may provide production throughputs on the order of at least five times greater than those of prior art multi-layer coating processes.

Other advantages of the sputtering apparatus and method for high throughput sputtering include: flexibility with respect to the composition of the multilayer films applied and the types of substrates to which they are applied; easily interchanged coating components; a novel means for heating substrates; a novel sputtering magnetron design; a variable speed, overhead, noncontaminating substrate transportation system; and a comprehensive, centralized, programmable electronic means for controlling the apparatus and process. In addition, when the process and apparatus are used for providing magnetic coatings for substrates, such as disks, to be utilized in hard disk drives using Winchester-type technology, also disclosed herein are: a unique disk texturing method for improving the disk's magnetic recording properties, and a novel disk carrier (or pallet) design which contributes to uniform substrate heating characteristics in a large, single, high capacity pallet.

The high throughput process and apparatus of the present invention accomplishes the objectives of the invention and provides the above advantages by providing a comprehensive in-line sputtering system utilizing matched component elements to process multiple large single sheet or pallet transported discrete substrates in a continuous, variable speed, sputtering process wherein each substrate has a start-to-finish process time which is relatively constant. Such an apparatus and method can process up to 3,000 95 mm disk substrates, and 5,300 65 mm disk substrates, per hour. In the disk drive industry where cost savings per disk on the order of a few cents are a distinct advantage, the system manufactures 95 mm disk substrates at a cost of $8.00 per disk as opposed to $12.00 per disk for other sputtering apparatus. Crucial to this process and apparatus are matching and optimizing such elements as disk preparation, including texturing and cleaning, provision of a sputtering environment with a sputtering apparatus, through an optimal vacuum pump system, transporting disk substrates through the sputtering environment in a high volume, high speed, contaminant-free manner without disturbing the sputtering environment, heating the substrates within the environment to optimal thermal levels for sputtering, and sputtering the substrates through a series of substantially isolated, non-crosscontaminating sputtering steps.

Figure 4:
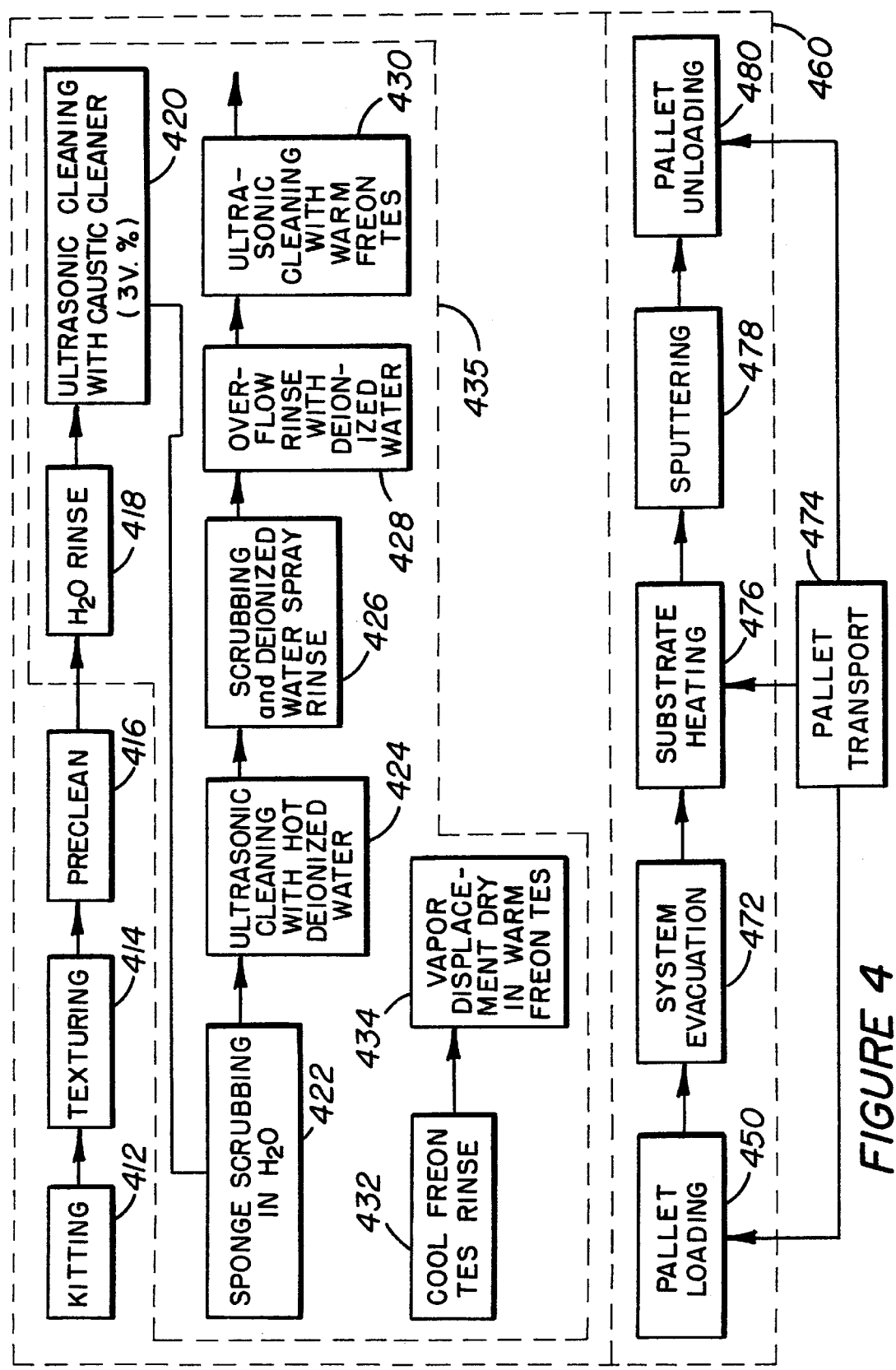
FIG. 4 is an overview block diagram of the sputtering process of the present invention.
Figure 6A:
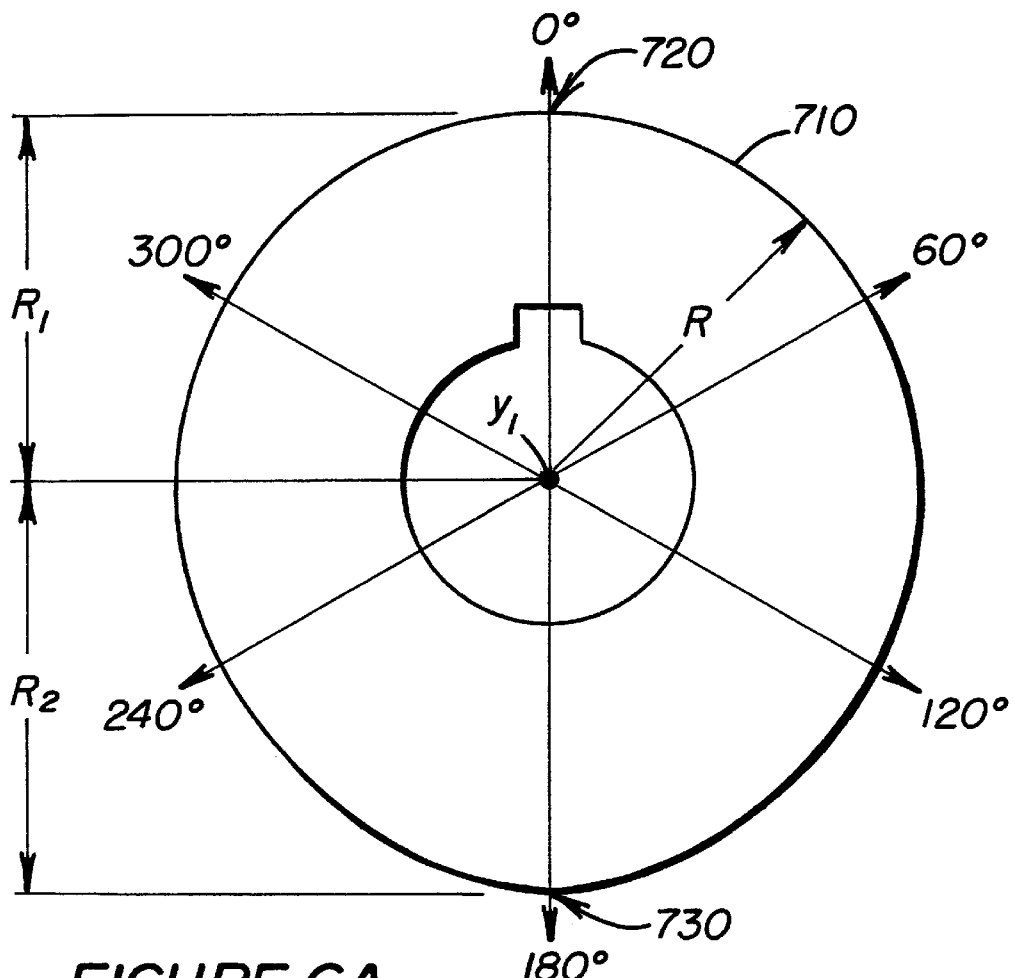
FIG. 6A is a cross sectional view along line 6—6 of the cam wheel utilized in the means for texturing shown in FIG. 5.
Figure 6B:
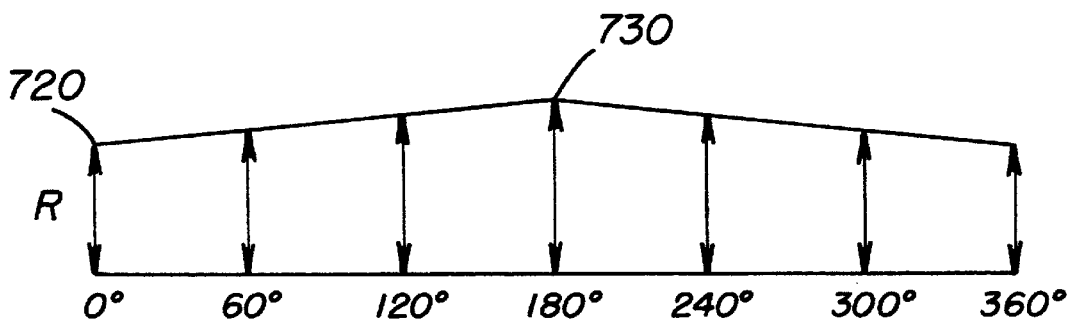
FIG. 6B shows a graph of the distance of all points along an outer edge of the cam shown in FIG. 6A from a central axis.
Figure 8:
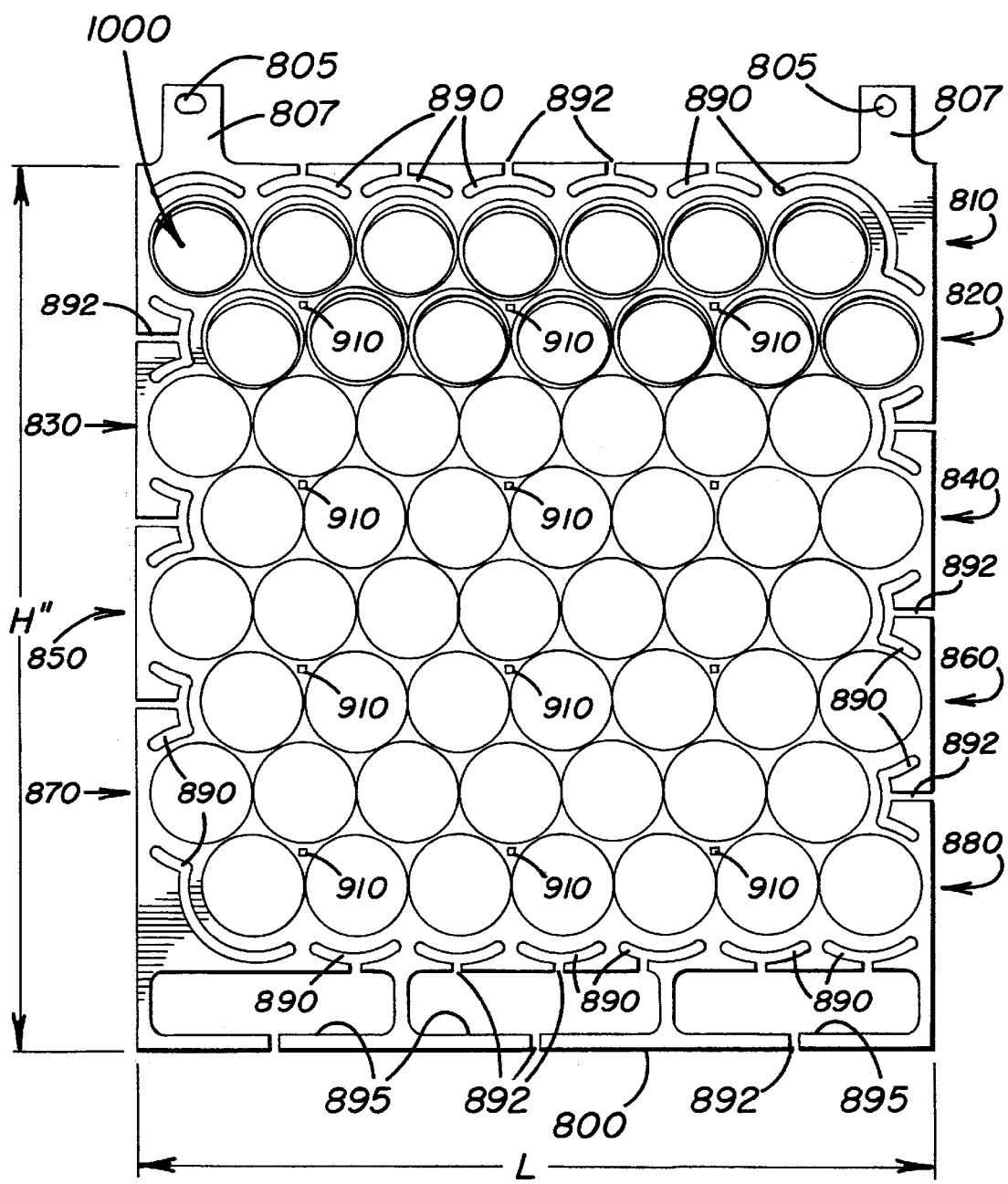
FIG. 8 is a surface view of one embodiment of a pallet for carrying disks through the sputtering apparatus of the present invention.
Figure 13:
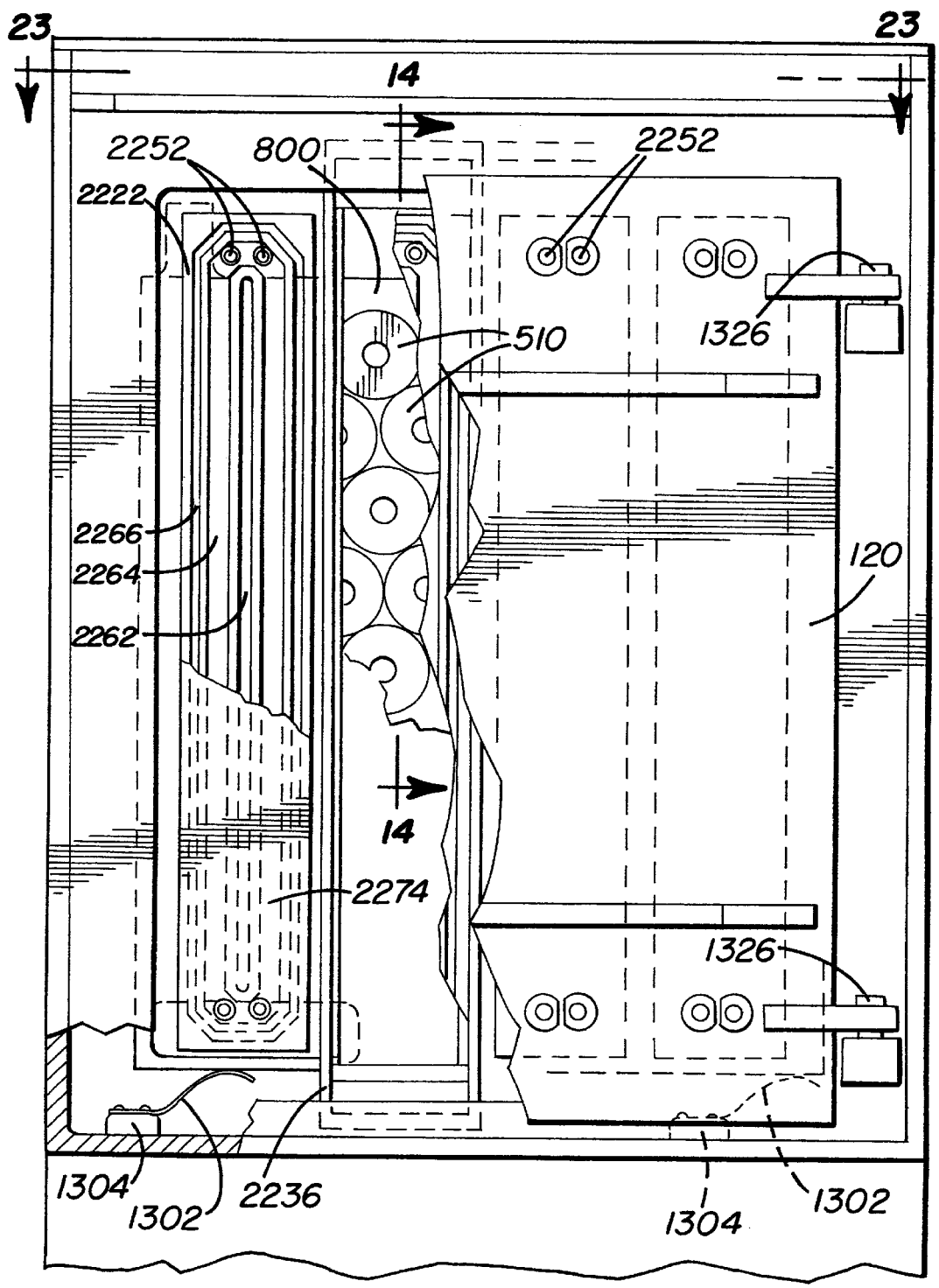
FIG. 13 is a side, partial cutaway view of a sputtering chamber utilized in the apparatus of the present invention.
Figure 14:
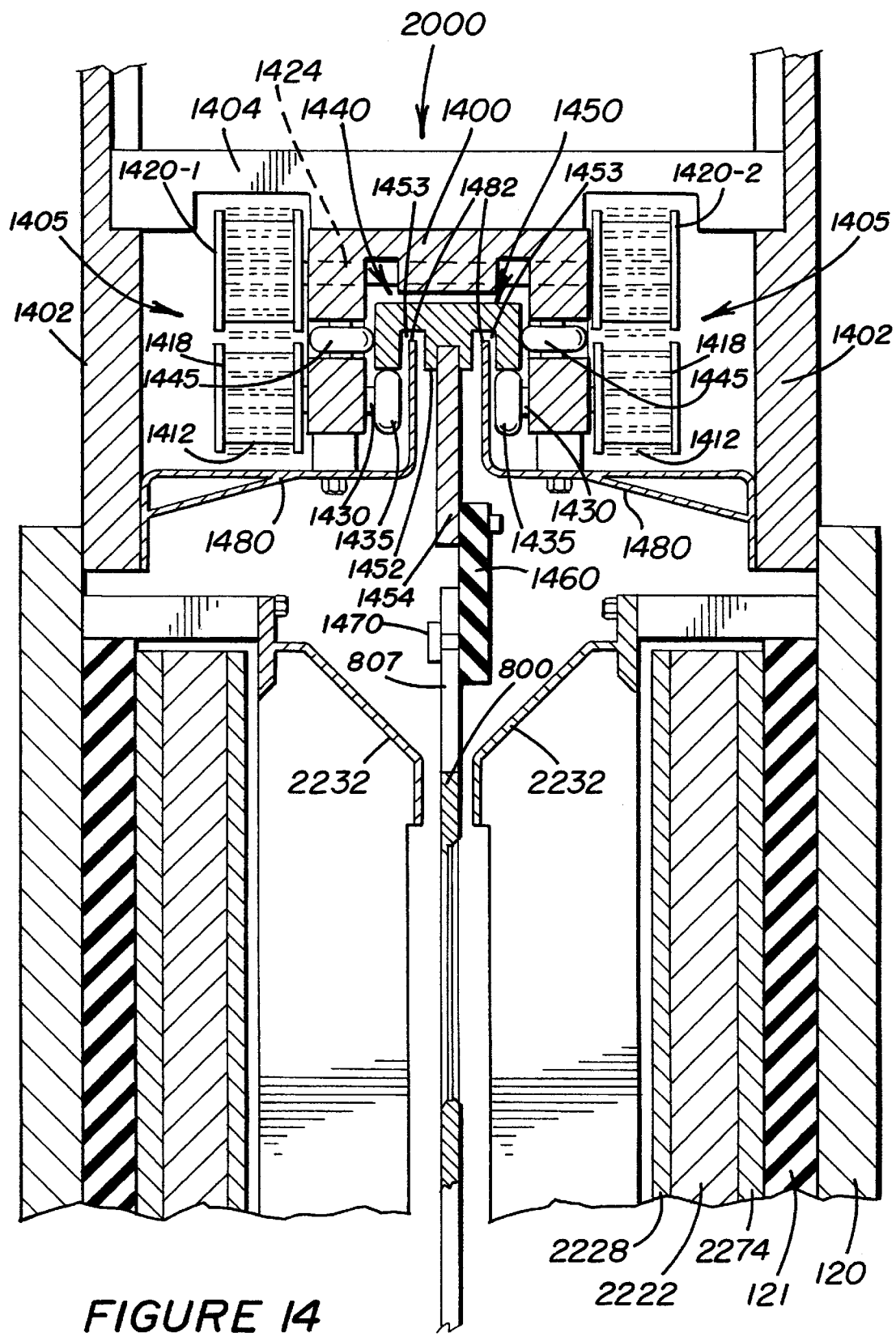
FIG. 14 is an assembled cross sectional view of the substrate transport mechanism, sputtering shields, and pallet viewed along line 14—14 of FIG. 13.

In general, application of multilayer films to a substrate involves two basic steps: preparation of the substrate and film deposition. FIG. 4 represents a general overview of the process for applying thin films to a disk substrate according to the present invention. In particular, FIG. 4 outlines the process steps for providing a single or multilayer film on a substrate, for example, a nickel-phosphorus plated aluminum disk for use in Winchester-type hard disk drives. It will be recognized by those skilled in the art that the steps outlined in FIG. 4 may be modified, as required, depending on the particular type of substrate to be coated or thin film to be applied.

Substrate preparation process 410 of FIG. 4 includes: kitting process 412; disk texturing process 414, disk pre-cleaning 416; water rinse 418; ultrasonic cleaning with caustic cleaner 420; a sponge scrubbing in water 422; an ultrasonic cleaning in hot deionized water 424; scrubbing and deionizing water spray rinse 426; overflow deionized water rinse 428; ultrasonic cleaning of the disks with warm FREON TES 430; a cool FREON TES rinse 432; and vapor displacement drying in warm FREON TES 434. Each of the aforementioned steps outlined in FIG. 4 is discussed in further detail in Section C of the specification.

Subsequent to the substrate preparation process 410, the clean, dry disk substrates may be provided to pallet loading process 450, wherein the disk substrates are provided to a substrate carrier which transports the disk substrates through coating process 460.

Figure 1:
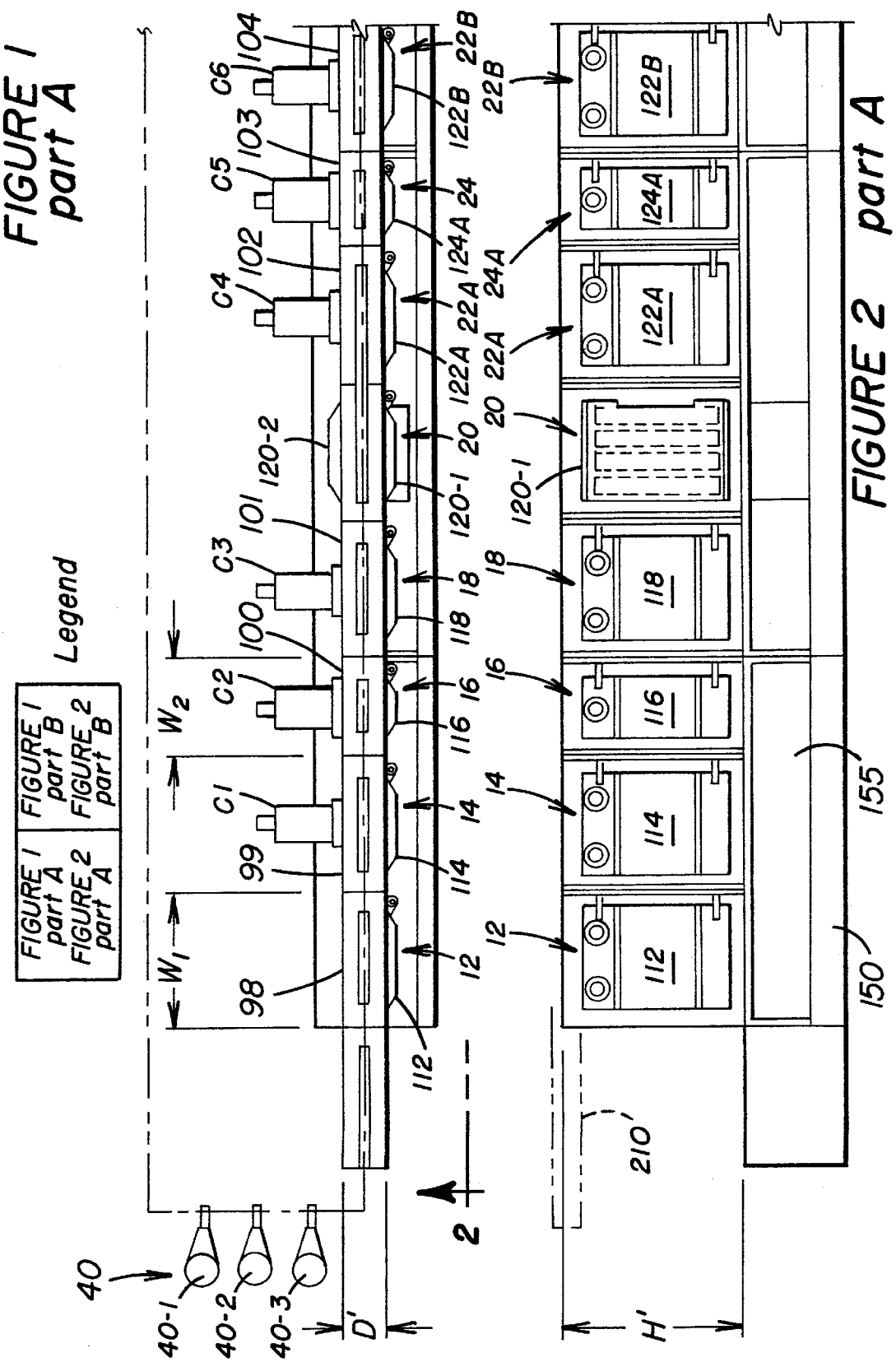
FIG. 1 is a system plan view of the sputtering apparatus of the present invention.
Figure 2:
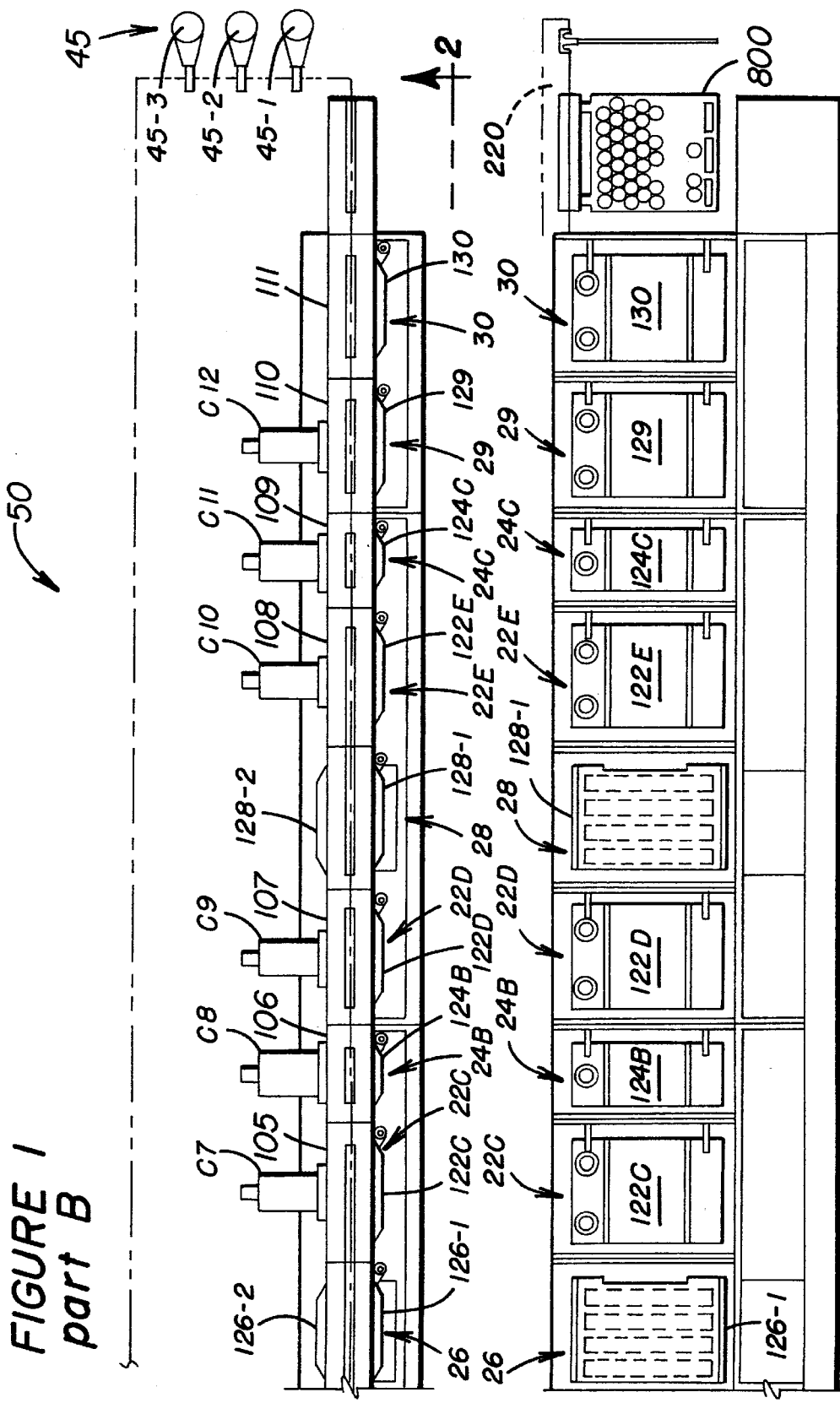
FIG. 2 is a cross sectional view along line 2—2 of the sputtering apparatus of the present invention as shown in FIG. 1.
Figure 3:
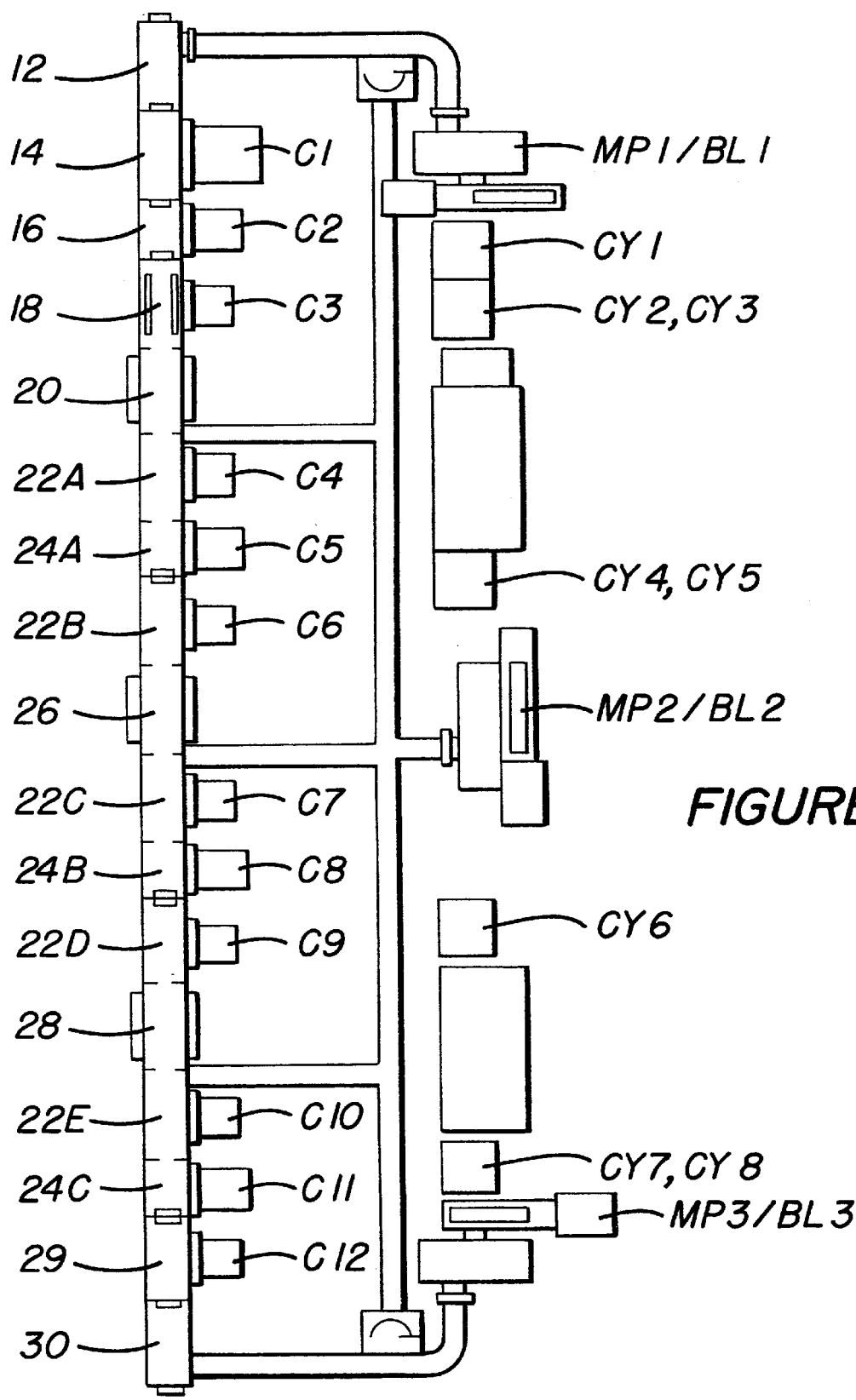
FIG. 3 is a plan view of the sputtering apparatus of the present invention illustrating the physical relationship of the power supply and pumping subsystem components.

In coating process 460, disk substrates are provided to a coating apparatus, such as sputtering apparatus 10 shown in FIGS. 1 and 2, for provision of single or multilayer film thereon. The steps involved in coating process 460, such as in, for example, sputtering apparatus 10 of the present invention, involve: a system evacuation process 472 wherein specific chambers of the sputtering system are evacuated to a pressure of approximately $10^{-7}$ Torr and backfilled with a suitable sputtering gas, such as argon; a substrate heating process 476, wherein the substrates are raised to a temperature conducive to optimal film deposition; and a sputtering process 478 wherein the films are deposited on the substrates. Subsequently, the substrates are provided to an unload process 480. A process for transporting pallets 474 provides means for transporting the substrates through the above processes.

Each of the aforementioned steps with respect to applying the multilayer films to the substrates is discussed below in detail in separate sections of this specification.

B. Sputtering Apparatus Overview

Sputtering apparatus 10, used to apply a single or multilayer film to one or more substrates, will be discussed generally with reference to FIGS. 1A, 1B, 2A, 2B, and 3. Sputtering apparatus 10 provides a high throughput, in-line, magnetron sputtering process which allows reduced manufacturing costs per substrate by performing the coating sequence in a high volume manner. As will be discussed in detail below, single or multilayer film can be applied to a single side, or both sides, individually or simultaneously, of a single large sheet substrate, or to discrete substrates, such as disks mounted in a rack, pallet or other substrate carrier.

Generally, substrates are provided through multiple sputtering chambers 20, 26, 28 in apparatus 10 at a rate of speed, such as 3–6 feet/minute, and through heater chambers 14,16 and buffer chambers 12, 18, 22A–E, 24A–24C, 29 and 30, at a second rate of speed, such as 12 feet/minute. Through carefully matched elements, each of the substrates has a constant speed through apparatus 10.

Sputtering apparatus 10 includes seventeen (17) chamber modules 12–30 generally comprised of two basic types. A first type is configured for use as lock modules (12, 30), deposition process modules (20, 26, 28) or dwell modules (14, 18, 22A–22D and 29). A second type of module is configured for use as high vacuum buffer modules (16, 24A–24C) to provide process separation between deposition modules as discussed below.

Also shown in FIGS. 1 and 2 is substrate carrier return path 50 of the transport system of the present invention. Preferably, return path 50 is provided to allow an ample number of substrate carriers to return from exit lock 30 for reuse in sputtering apparatus 10 in a continuous process, thereby reducing production delays and increasing overall process production speed. In addition, FIGS. 1 and 2 illustrate robotic pallet loading station 40 and robotic pallet unloading station 45, arranged along the transport system return path 50, for automatic loading and unloading, respectively, of the disk substrates into racks or pallets. As discussed in detail below, the substrate transport system utilizes a plurality of individual transport beam platforms, each including one or more optical or proximity position sensors, to move substrates through sputtering apparatus 10 and along return path 50, and to monitor the position of each substrate carrier within the transport system. Transfer speeds of the substrate carriers throughout the transport system may be adjustably varied from 0 to 24 ft/min. It should be noted that the upper limit of substrate carrier transport speed is constrained by the process limits of sputtering apparatus 10. Each individual drive stage (2200, discussed in Section F of this specification) is identical and thus has identical upper and lower speed limits.

Twelve (12) pneumatically operated doors D1–D12 are placed between specific chamber modules 12–30 of sputtering apparatus 10. Doors D1–D12 are located as generally represented in FIG. 12 and are positioned as follows: door D1 isolates chamber 12 from the ambient environment; door D2 isolates load lock chamber 12 from main ("dwell") heating chamber 14; door D3 isolates main heating chamber 14 from first buffer-passby heating chamber 16; door D4 isolates buffer chamber 16 from first dwell chamber 18; doors D5-D6 isolate second buffer chamber 24A from third dwell chamber 22B; doors D7-D8 isolate third buffer chamber 24B from fifth dwell chamber 22D; doors D9-D10 isolate fourth buffer chamber 24C from exit buffer 29; door D11 isolates exit buffer chamber 29 from exit lock chamber 30; and door D12 isolates exit lock chamber 30 from the ambient environment.

With reference to FIGS. 1–3 and 12, the general arrangement of chamber modules 12–30 will be hereinafter discussed. Load lock chamber 12 is essentially an isolation chamber between the ambient environment and chambers 14–29 of sputtering apparatus 10. Load lock chamber 12 is repeatedly evacuated between a pressure of approximately 50 mTorr and vented to ambient atmospheric conditions. Generally, sputtering within apparatus 10 takes place in an evacuated environment and chambers 16–29 are evacuated to the pressure of approximately $10^{-7}$ Torr, before argon gas is allowed to flow into the chambers to achieve a suitable sputtering pressure. Load lock chamber 12 is constructed of one-inch thick type 304 stainless steel and has a width $W_1$ of approximately 39 inches, length $L_1$ of approximately 49 inches, and a depth $D_1$ of approximately 12 inches as measured at the exterior walls of the chamber. The use of electropolished stainless steel in load lock chamber 12 and all other chambers in apparatus 10 minimizes particulate generation from scratches and other surface imperfections. Chambers 14, 18, 20, 22A–22D, 24A–24C, 26 and 28–30 have roughly the same dimensions. The internal volume of load lock chamber 12 is reduced to approximately three cubic feet by the installation therein of volume-displacing solid aluminum blocks bolted to the chamber door and rear wall (not shown) to facilitate faster evacuation times. Pumpdown of load lock chamber 12, and sputtering apparatus 10 in general, is discussed below in Section F of the specification.

After door D1 is pneumatically operated to allow a single large substrate or pallet to enter load lock chamber 12 at the initiation of processing by sputtering apparatus 10, load lock chamber 12 will be evacuated to a pressure of 50 microns (50 mTorr). Chambers 16–29 will have been evacuated to a base pressure of about $10^{-7}$ Torr and then backfilled with argon to the sputtering pressure (approximately 9–12 mTorr) prior to the entrance of a substrate into load lock chamber 12. Chamber 14 will have been evacuated previously to a pressure of approximately $10^{-5}$–$10^{-7}$ Torr. Load lock chamber 12 is thus mechanically evacuated and pressurized at a level intermediate to that of chambers 14–29, and external ambient pressures, to provide isolation for the downstream sputtering processes occurring in chambers 14–29.

Dwell heating chamber 14 serves two functions: it acts as an entrance buffer between load lock chamber 12 and the internal sputtering environment in chambers 16–29; and it serves as a heating chamber for increasing the substrate temperature to optimize film deposition. Chamber 14 includes eight banks of quartz lamp heating elements, four banks mounted to outer door 114 and four banks mounted opposite thereof on rear chamber wall 99. Door D2, separating load lock chamber 12 and dwell heating chamber 14, is a high vacuum slit valve. Details of the heating banks located in dwell heating chamber 14 are discussed in Section H of this specification.

During processing of a substrate, dwell heating chamber 14 is pumped to a pressure of approximately $10^{-5}$–$10^{-7}$ Torr before the substrate present in load lock chamber 12 is allowed to pass into dwell heating chamber 14. A pressure of $10^{-5}$–$10^{-7}$ Torr helps eliminate the effects of outgassing from the substrate in dwell heating chamber 14. Subsequently argon backfilling is provided to raise the pressure to approximately 9–12 mTorr, equalizing the environment in dwell heating chamber 14 with that in chambers 16–29. The substrate may thereafter remain in dwell heating chamber 14 for the duration of time necessary for the exposure of the substrate to the lamps to have its desired effect.

First buffer-passby heating chamber 16 is a chamber module of the second type having a width $W_2$ of approximately 26 inches by a height H' of approximately 49 inches by a depth D' of approximately 12 inches. In general, buffer chambers 16 and 24A–C are positioned between dwell chambers 18A and 22A–D to separate the ongoing sputtering processes within apparatus 10, thereby reducing cross-contamination of coating components.

First buffer-passby heating chamber 16 includes a heating assembly comprising ten banks of quartz lamp heating elements, five mounted to outer door 116 and five to the rear chamber 100 wall opposite thereof. Passby heating chamber 16 is designed to insure uniform substrate temperature prior to film deposition. The structure of the passby heating assembly is discussed in detail in Section H of this specification.

Three coating modules—chromium deposition chamber 20, magnetic deposition chamber 26, and carbon deposition chamber 28—having dimensions roughly equal to those of load lock chamber 12 and constructed of type 304 electropolished stainless steel, may be utilized to sputter single or multilayer films on a substrate passing through apparatus 10. Four pairs of d. c. magnetron sputtering cathodes are mounted, four magnetrons per door, on doors 120-1, 120-2, 126-1, 126-2, 128-1, and 128-2 on both sides of each chamber 20, 26, and 28, respectively. Target materials are mounted to cathodes 2222–2225. Anodes 2338, gas manifolds 2323, and shielding 2230, 2236, 2238 and 2240 are also attached to outer doors 120-1, 120-2, 126-1, 126-2 and 128-1, 128-2. Mounting these components to the doors facilitates target changes and chamber maintenance. Further, conduits (not shown) for power, cooling, and process gases are provided in outer doors 120, 126, 128. Feedthrough conduits are also provided in doors 112, 114, 116, 118, 122A–122E, 124A–124C, 129, and 130 to allow for modification of the sputtering apparatus 10. Details of deposition chambers 20, 26 and 28 are provided in Section I of this specification.

Dwell chambers 18 and 22A–22E are manufactured to have the same dimensions as load lock chamber 12 and provide separation between the buffer modules and the deposition chambers. Dwell modules 18 and 22A–22E allow for substrate transport system runout, if necessary, during multiple substrate processing in sputtering apparatus 10. If desired, additional heating assemblies may be provided in any or all of dwell modules 22A–22E.

Exit buffer module 29 is essentially identical to dwell heating chamber 14, without the dwell heating assembly hardware. Exit buffer module 29 provides a buffer area to facilitate removal of pallets or substrates from sputtering apparatus 10 to exit lock chamber 30 and further isolates the sputtering process from the external environment.

Exit lock chamber 30 is essentially identical to load lock chamber 12 and operates in reverse pumping order, allowing pallets or substrates to be transferred from the evacuated environment of sputtering apparatus 10, to the ambient external environment.

Optimally, sputtering apparatus 10 can simultaneously process up to seven large single sheet substrates or pallets carrying smaller substrates, such as disks. When seven such substrates are simultaneously processed in sputtering apparatus 10, one such substrate is positioned in each of seven chambers, for example, as follows: load lock chamber 12; dwell heating chamber 14; chromium deposition chamber 20; magnetic deposition chamber 26; carbon deposition chamber 28; exit buffer chamber 29; and exit lock chamber 30. The sheer dimensions of sputtering apparatus 10 allow for a plurality of large single sheet substrates, and a plurality of high capacity discrete substrate carrying pallets, or both, to be simultaneously processed. The problems attending the development of such a large scale, high throughput sputtering apparatus, and the solutions adopted, are discussed herein.

Chambers 12–30 are mounted on steel assembly rack 150. Rack 150 includes channels 55 which preferably are used to mount components used with sputtering apparatus 10, such as those used in the electronic control system. It will be understood by those skilled in the art that any suitable arrangement for mounting chambers 12–30 may be made within contemplation of the present invention.

H. Substrate Heating System

Uniform substrate temperature is crucial to producing a superior thin film by sputtering processes. FIGS. 15 through 21 illustrate a heating assembly configuration which accomplishes this goal in sputtering apparatus 10.

Specifically, sputtering apparatus 10 includes a heating assembly whose elements are distributed between dwell heating chamber 14, passby heating chamber 16 and dwell chambers 18 and 22.

Figure 17:
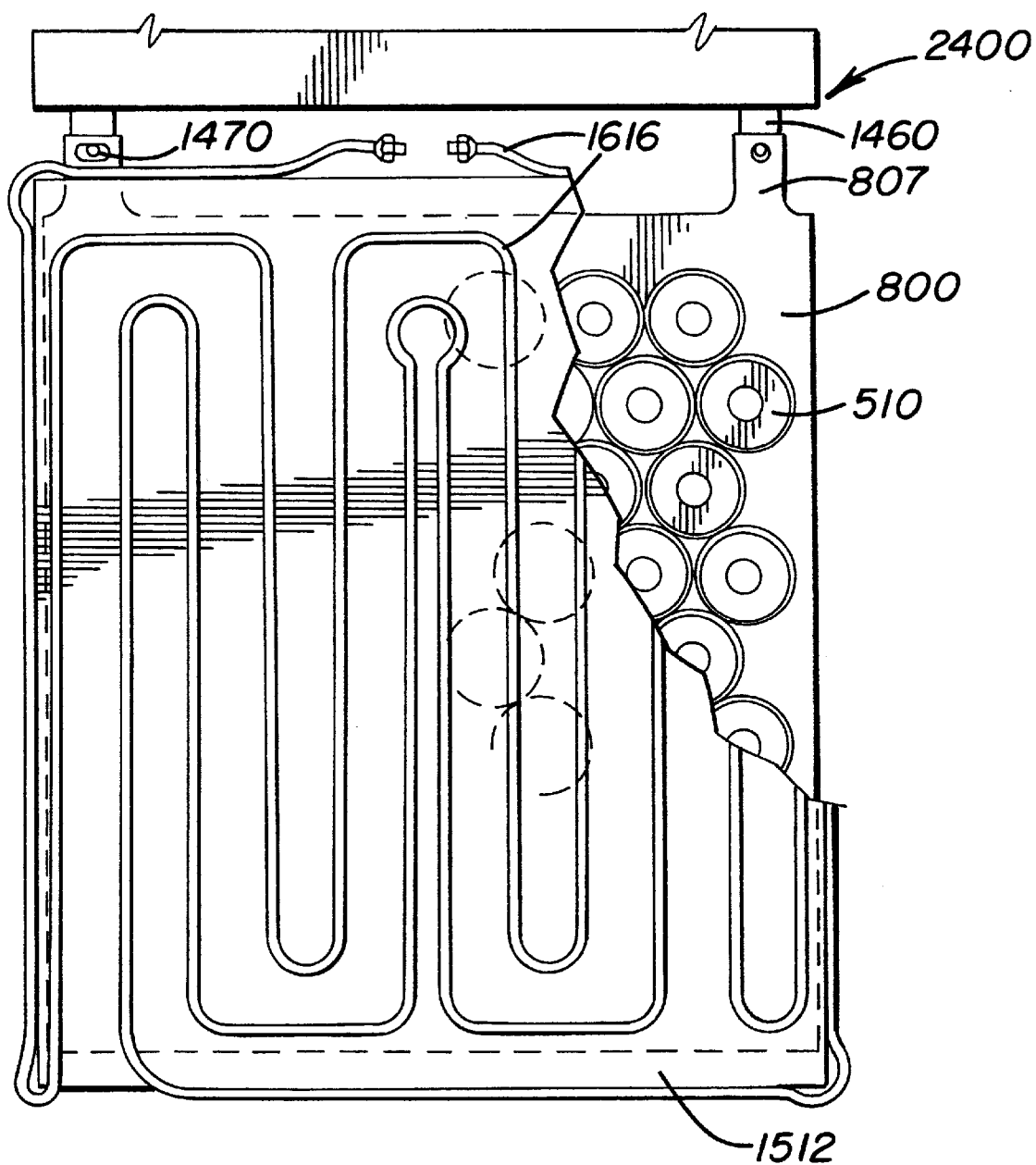
FIG. 17 is a view of the main heating lamp mounting tray and cooling lines along line 17—17 in FIG. 15.

As shown in FIGS. 15 through 17, dwell heating chamber 14 features eight horizontal banks 1510A, 1510B, 1510C, 1510D, 1620A, 1620B, 1620C, 1620D of tubular quartz radiant heating lamps 1514. Banks 1510A, 1510B, 1620A and 1620B are housed in one shallow gold-plated stainless steel tray 1512 and banks 1510C, 1510D, 1620C and 1620D are housed in a second shallow gold-plated stainless steel tray 1512. Each bank 1510A, 1510B, 1510C, 1510D includes eleven 1.5 kW lamps 1514 connected in parallel, vertically aligned and interdigitated to overlap lamp ends between the banks. Individual lamps are separated horizontally by a distance of 3 inches. Each bank 1620A, 1620B, 1620C and 1620D includes three 1.5 kW lamps 1514 connected in parallel, horizontally aligned and interdigitated to overlap lamp ends within each bank. Tubular quartz radiant heating lamps, such as those commercially available from General Electric Corporation Lamp Division of Albany, N.Y. are suitable for this purpose.

Within each tray 1512, banks 1510A, 1510B, 1620A and 1620B, and banks 1510C, 1510D, 1620C and 1620D are arrayed vertically. Trays 1512 measure 37.5 in. long (1) by 2⅝ in. deep (d) by 32⅜ in. wide (w), with one tray 1512 mounted on chamber door 114, and the other mounted on rear chamber wall 99. Each tray 1512 is protected from overheating by a circulating coolant fluid provided through cooling lines 1516.

As shown in FIGS. 18 through 20, passby heating chamber 16 includes ten horizontal banks 1818A, 1818B, 1818C, 1818D, 1818E, 1818F, 1920A, 1920B, 1920C, and 1920D of tubular quartz radiant heating lamps 1514. Each bank 1818A, 1818B, 1818C, 1818D, 1818E, and 1818F features six 1.5 kW lamps 1514 of the same type and mounted in the same fashion as those in dwell heating chamber 14. Individual lamps 1514 are separated by a distance of 2 inches. Each bank 1920A and 1920B features a single horizontally aligned 1.5 kW lamp 1514.

Banks 1818A, 1818B, 1818C, 1920A and 1920B, are arrayed vertically in gold-plated stainless steel tray 1812 and banks 1818D, 1818E, 1818F, 1920C and 1920D are arrayed vertically in a second gold-plated stainless steel tray 1812. With the exception of housing five horizontal banks each, instead of four, trays 1812 are identical in measurement and respective mounting to chamber door 116 and rear chamber wall 100 as trays 1512 in dwell heating chamber 14. Likewise, trays 1812 feature cooling lines 1716 to provide protection from overheating.

The output from banks 1510A, 1510B, 1510C, 1510D, 1620A, 1620B, 1620C, 1620D, 1818A, 1818B, 1818C, 1818D, 1818E, 1818F, 1920A and 1920B, may be set and monitored for individual lamp operating voltages and currents via the electronic controlling system, described fully in Section K, to operate at desired power levels and for desired periods of time. In the present embodiment, heater banks 1510A–1510D, 1620A-1620B, 1818A–1818F, and 1920A–1920D are operated in sets, wherein each set comprises banks 1510A/1510B, 1510C/1510D, 1620A/1620C, and 1620B/1620D, operated in parallel. Alternatively, bank sets 1620A/1620C, 1620B/1620D, 1510A/1510C, and 1510B/1510D, may be operated in parallel. Similarly, opposing banks 1818A/1818D, 1818B/1818E, 1818C/1818F, and 1920A/1920D are adjustably controlled in parallel. Preferably, independent control of each bank 1510A–1510D, 1620A-1620B, 1818A–1818F, and 1920A-1920B, may be provided by the electronic control system. Such control of banks 1510A, 1510B, 1510C, 1510D, 1620A, 1620B, 1620C, 1620D, 1818A, 1818B, 1818C, 1818D, 1818E, 1818F, 1920A, 1920B, 1920C, and 1920D facilitates adjustment of heating power to meet the preheating requirements of different substrate materials.

Figure 21:
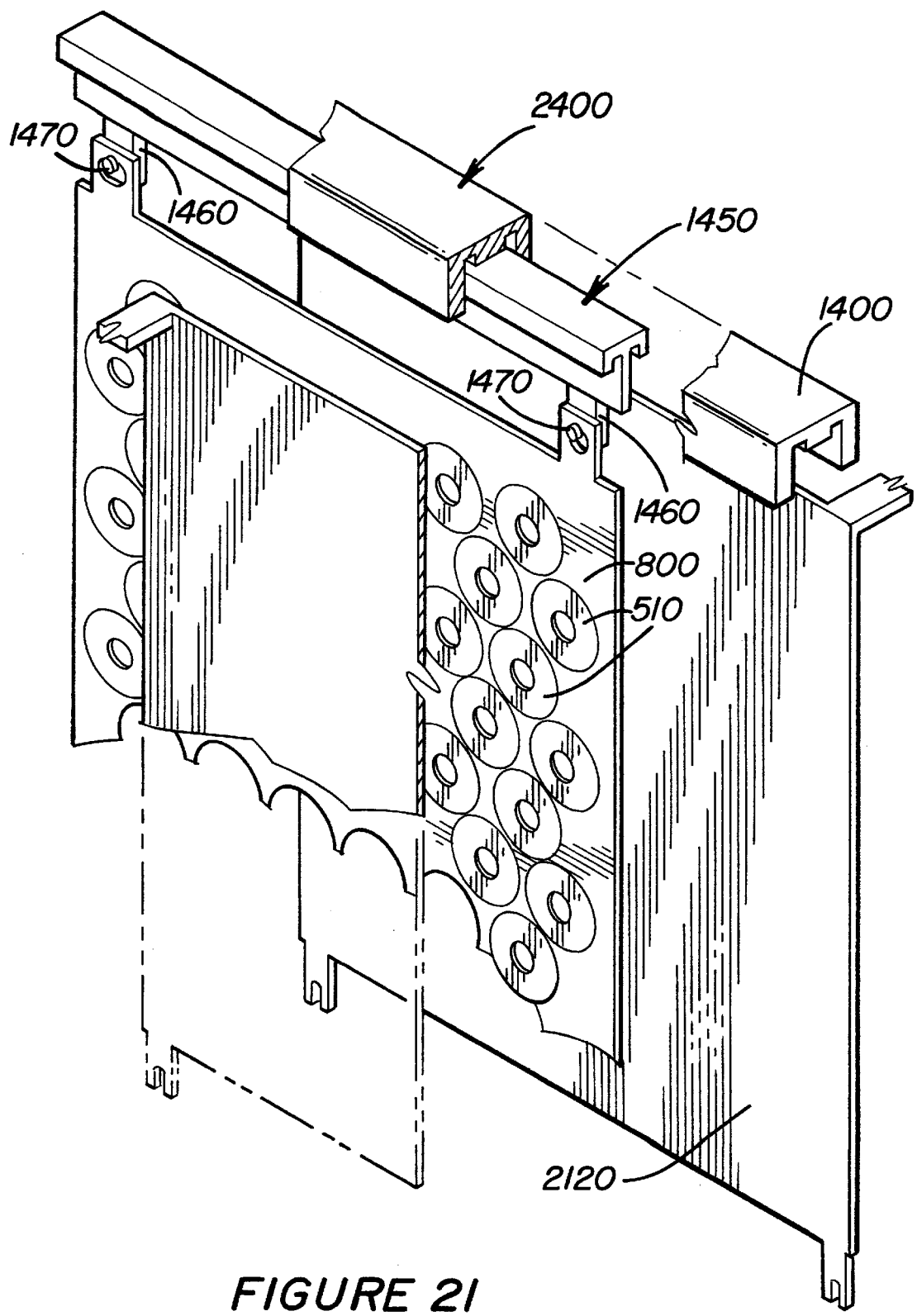
FIG. 21 is a perspective, partial view of a heat reflecting panel, pallet, and substrate transport system utilized in the apparatus present invention.
Figure 22:
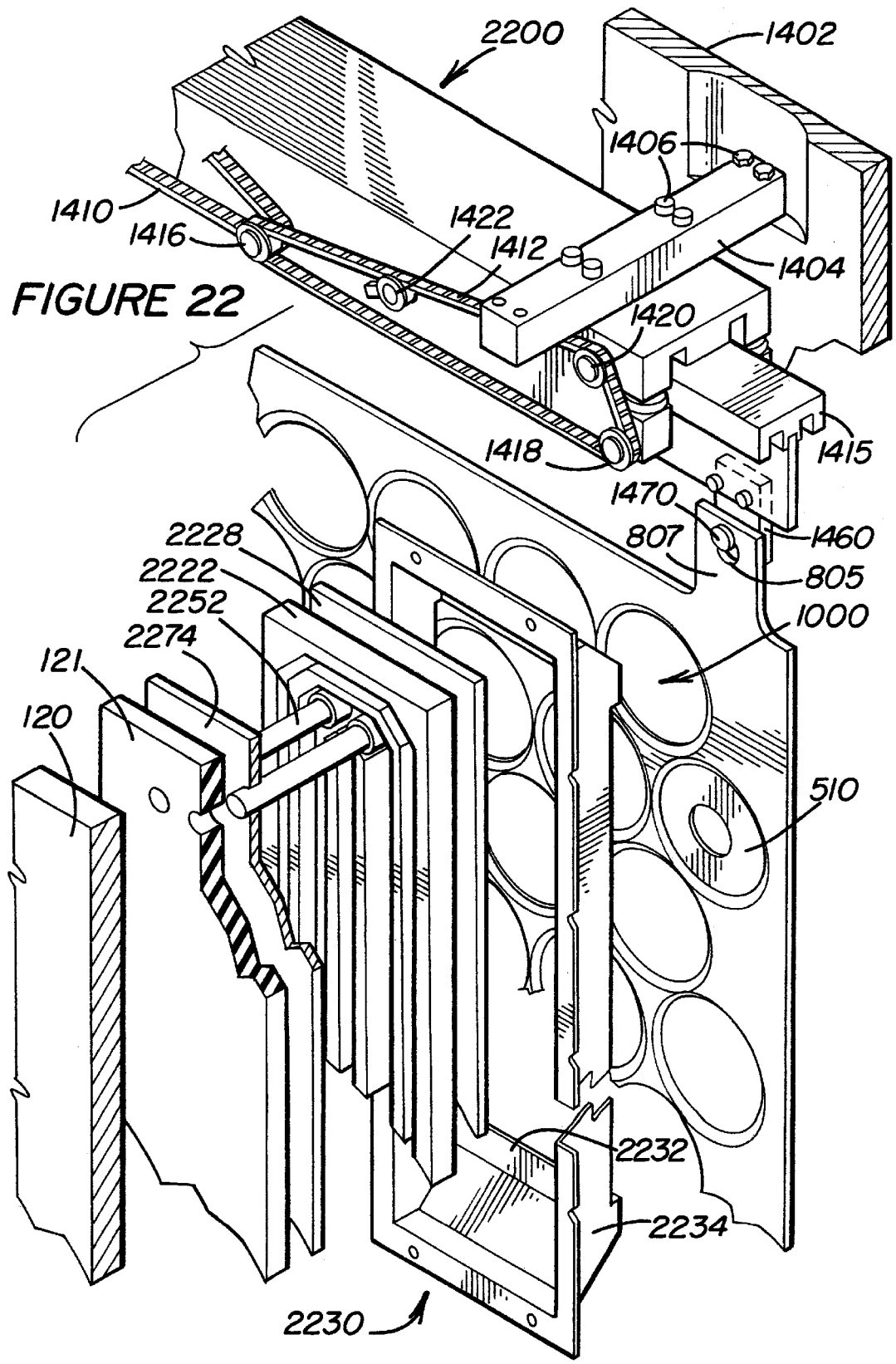
FIG. 22 is a perspective, exploded view of a portion of a pallet, substrate transport mechanism, sputtering shield, and cathode assembly utilized in the sputtering apparatus of the present invention.
Figure 23:
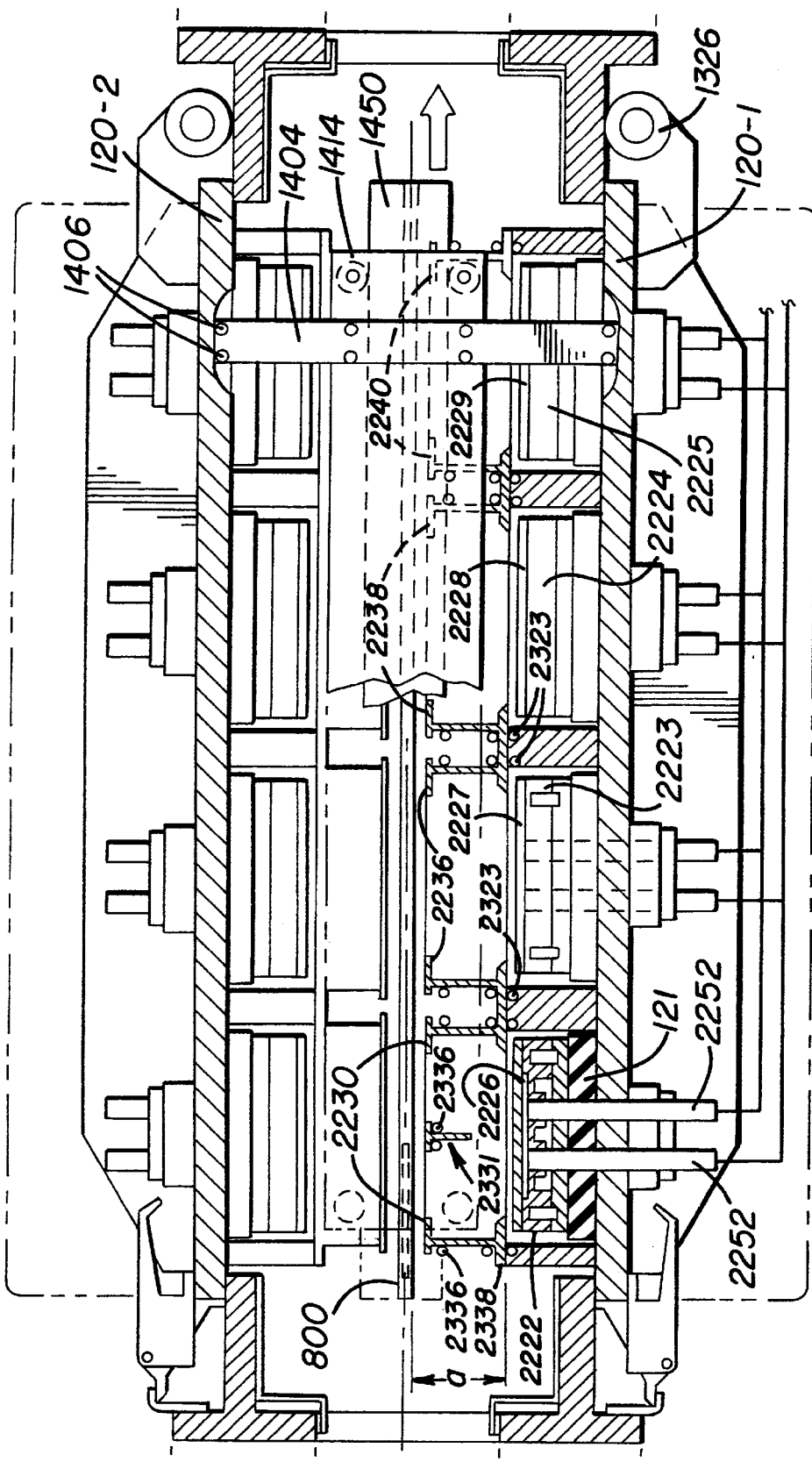
FIG. 23 is a top view of the sputtering chamber shown in FIG. 13.
Figure 24:
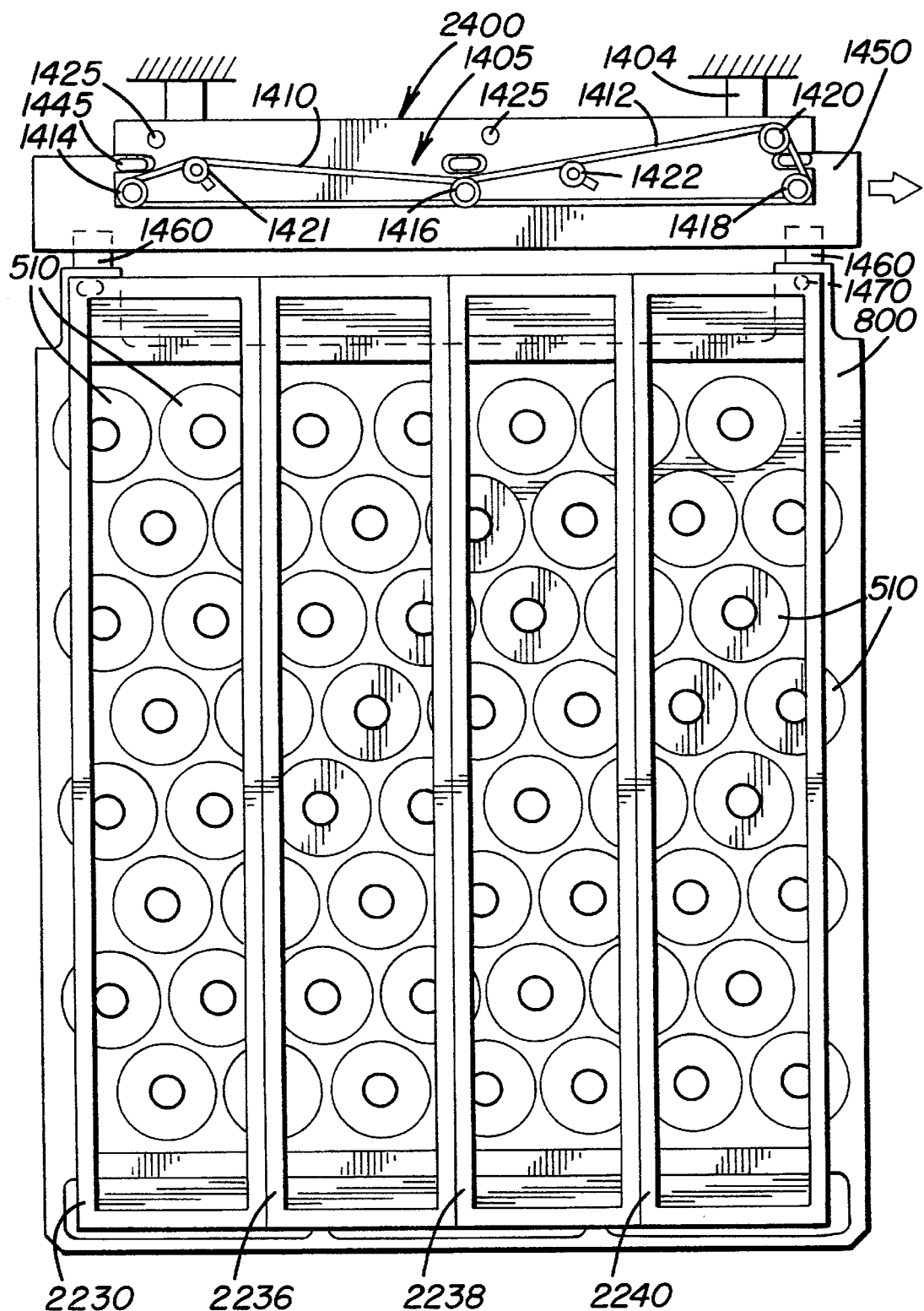
FIG. 24 is a cross-sectional, side view along line 24—24 of FIG. 23.
Figure 28:
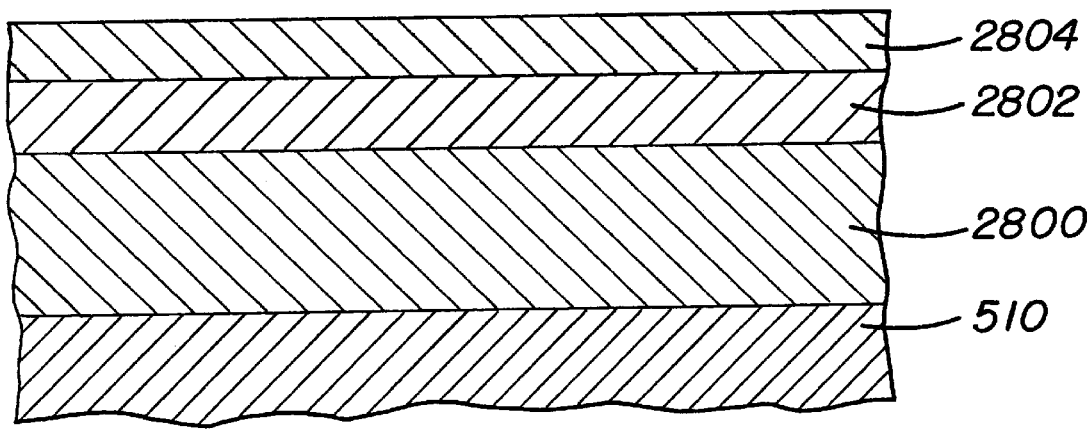
FIG. 28 is a cross sectional view of the multi-layer sputtered thin film created by the process of the present invention.

As shown in FIG. 21, dwell chambers 18 and 22A and 22B each have two gold-plated stainless steel reflecting panels 2120, one each on opposite chamber walls 118, 122A, and 122B and rear chamber walls 101, 102 and 104. Reflecting panels 2120 measure 34⅜ in. in length by 28 in. in width by 0.09 in. thick.

The heating assembly cooperates with the other elements of sputtering apparatus 10 to contribute to the overall high throughput and high quality sputtered films produced. Specifically, as pallet 800 proceeds through dwell heating chamber 14, banks 1510A, 1510B, 1510C, 1510D, 1620A, 1620B, 1620C and 1620D rapidly commence heating to warm both sides of disk substrates 510 before film deposition. If, for example, the desired substrate temperature is about 200° C., the heating time in dwell heating chamber 14 is approximately 30 seconds. Heating lamp warmup time is negligible since low power (about 143 W) is delivered continuously to the lamps to keep lamp filaments warm.

In the geometrically uniform array of heating lamps created by banks 1510A, 1510B, 1510C and 1510D, more heat is radiated towards disk substrates 510 carried in the center of pallet 800 as compared to disk substrates 510 carried in rows 810, 820, 870 and 880. In combination with efficient heat reflection from gold-plated stainless steel trays 1512, there is a need to equalize across pallet 800 the amount of heat radiated to individual disk substrates 510. Banks 1620A and 1620B serve as 'trim heaters' to boost the amount of heat radiated to disk substrates 510 carried in rows 810, 820, 870 and 880 of pallet 800. Although such trim heaters are not required, through equalization of heat distribution across pallet 800, trim heaters 1620A and 1620B allow control of coercivity of the deposited film to within about 60 Oe.

To further insure uniform substrate temperature prior to film deposition, a second heating cycle is performed in passby heating chamber 16. Pallet 800 enters passby heating chamber 16 through door D3. The electronic control system enables high power input to banks 1818, 1920, for example, through internal software timers or by reading the output of optical sensor SEN10 (shown generally in FIG. 12) capable of detecting pallet motion through the sputtering apparatus 10. As pallet 800 begins to depart passby heating chamber 16, the electronic control system reduces the power of those lamps 1514 positioned at the leading edge of pallet 800 or turns off power to those lamps entirely in response to timing parameters incorporated in the electronic control system software, or sensor SEN13, in order to avoid relative overheating of the trailing edge of the pallet 800.

Banks 1818A, 1818B, 1818C, 1818D, 1818E, 1818F, 1920A and 1920B are initiated and will deliver heat for a preset, empirically determined time as monitored by a software timer in the electronic control system. In addition, a software delay timer is triggered to control the opening of door D3, allowing pallet 800 to proceed into passby heating chamber 16. As a result, when pallet 800 triggers SEN13 in dwell chamber 18, after a certain period, lamps 1514 on the leading edge of pallet 800 are reduced in power or turned off entirely, depending on the transport speed through dwell chamber 18. In addition, a Mikron temperature sensor (not shown) may be positioned at the entrance of passby heating chamber 16, allowing the system operator through the electronic control system to adjust the power output of banks 1818A, 1818B, 1818C, 1818D, 1818E, 1818F, 1920A, 1920B, 1920C and 1920D to compensate for thermal variations between disk substrates 510 and across pallet 800. In this manner, a uniform temperature profile is established across the surface of pallet 800 and between individual disk substrates 510, thereby avoiding higher coercivities for those substrates positioned on the trailing edge of pallet 800.

Radiative heat losses from pallets and substrates proceeding through sputtering apparatus 10 are minimized by virtue of gold-plated stainless steel reflective panels 2120.

The cooperation of these elements in the heating assembly contributes to the high throughput of sputtering apparatus 10 by promoting rapid and uniform heating of substrates before film deposition. The heating assembly also efficiently maintains the desired substrate temperature by minimizing radiative heat losses as disk substrates 510 proceed through sputtering apparatus 10. Moreover, integration with the electronic control system introduces added flexibility with respect to selecting and adjusting dwell times and heating rates as required by different substrates and sputtered films.

K. Electronic Control System

The electronic control system for sputtering apparatus 10 and the process of the present invention provides one or more system operators with the means to comprehensively and efficiently control production throughput, applied sputtering power, and other sputtering apparatus parameters. The electronic control system is preferably programmable to allow a plurality of different operating parameter settings to be stored for each of the adjustably controlled elements of the sputtering process. Thus, the electronic control system generally performs two major functions: (1) monitoring sputtering apparatus 10 by reading data input from every aspect of sputtering apparatus 10, and providing status data to the system operator(s); and (2) controlling the sputtering process by providing user-controlled and automatically generated control signals to the functional elements of sputtering apparatus 10.

Figure 32A:
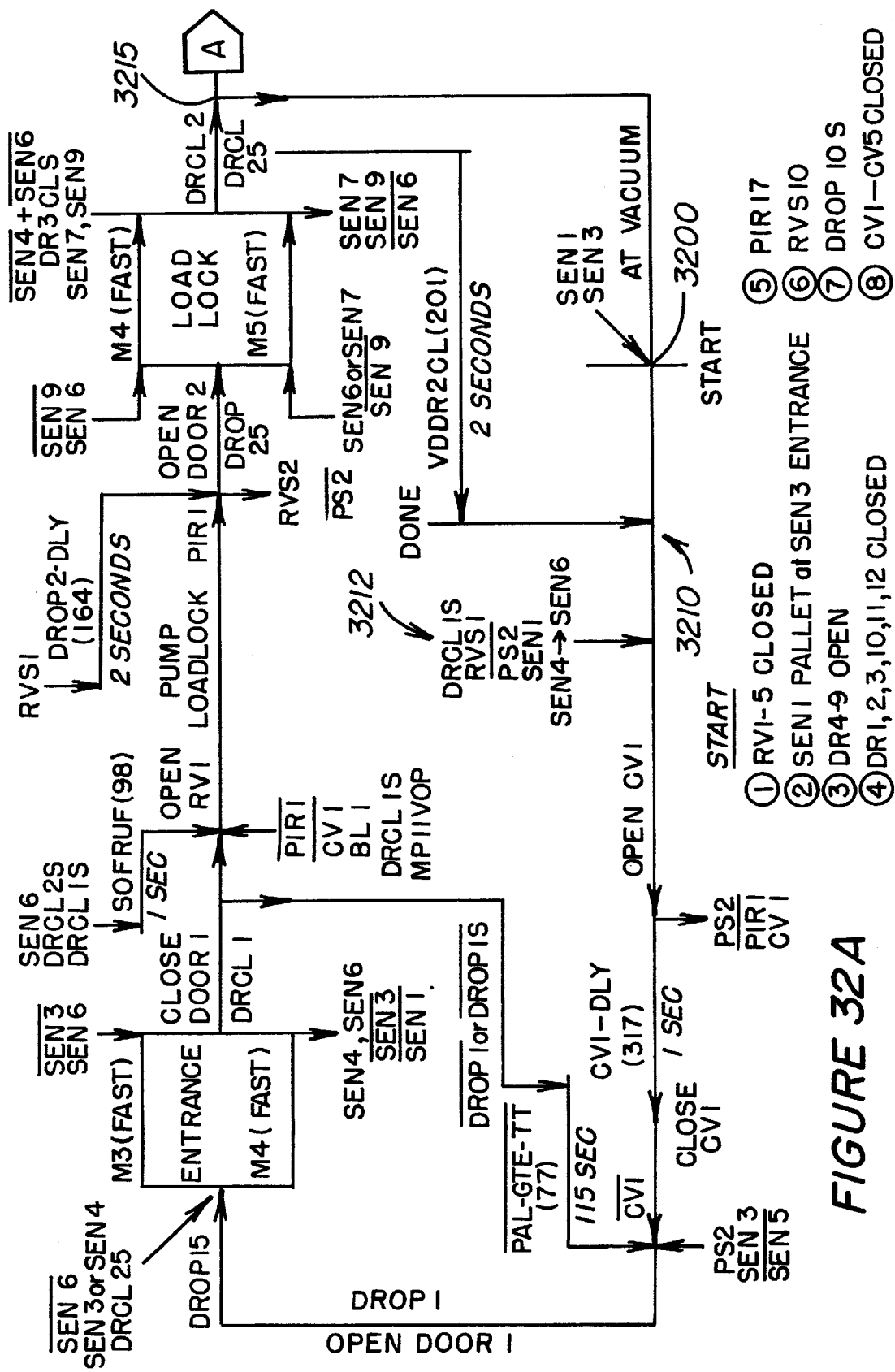
FIGS. 32A through 32E comprise a single logical flow diagram outlining the software logic controlling the motor assemblies, load lock and exit lock pumping, and heater power during the automatic substrate run mode of the software utilized in the electronic control system of the present invention.
Figure 32B:
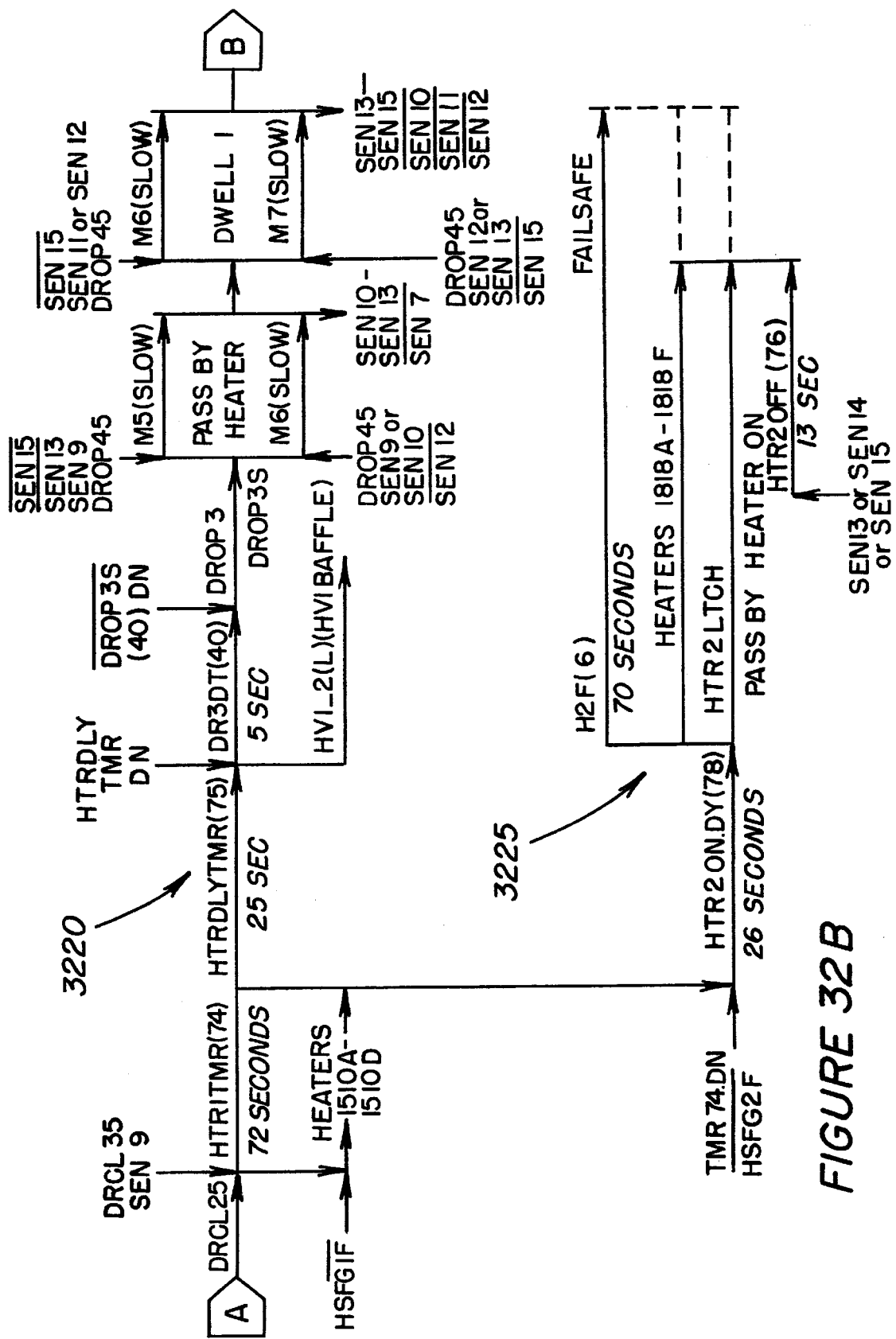
Figure 32C:
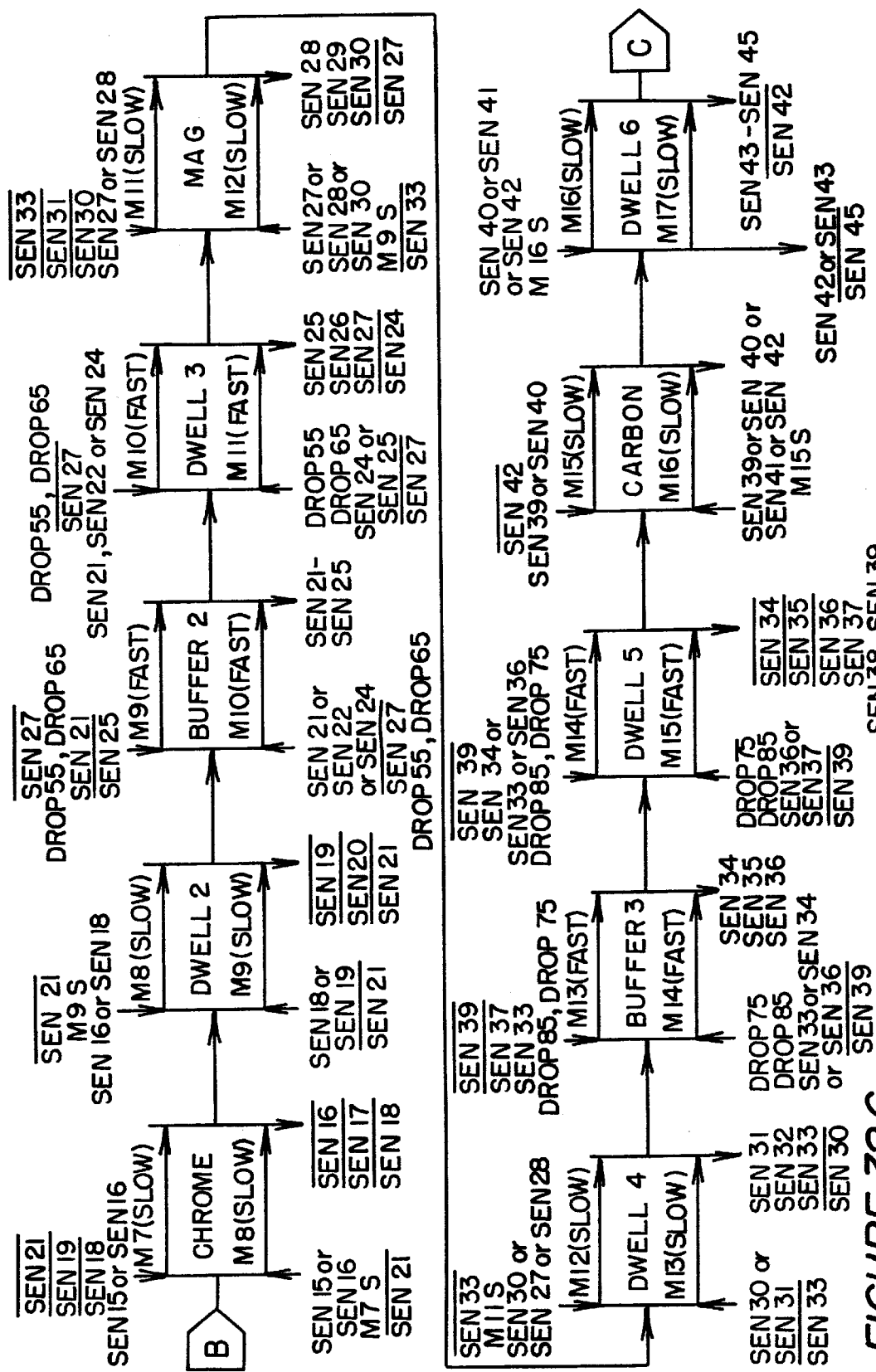
Figure 32D:
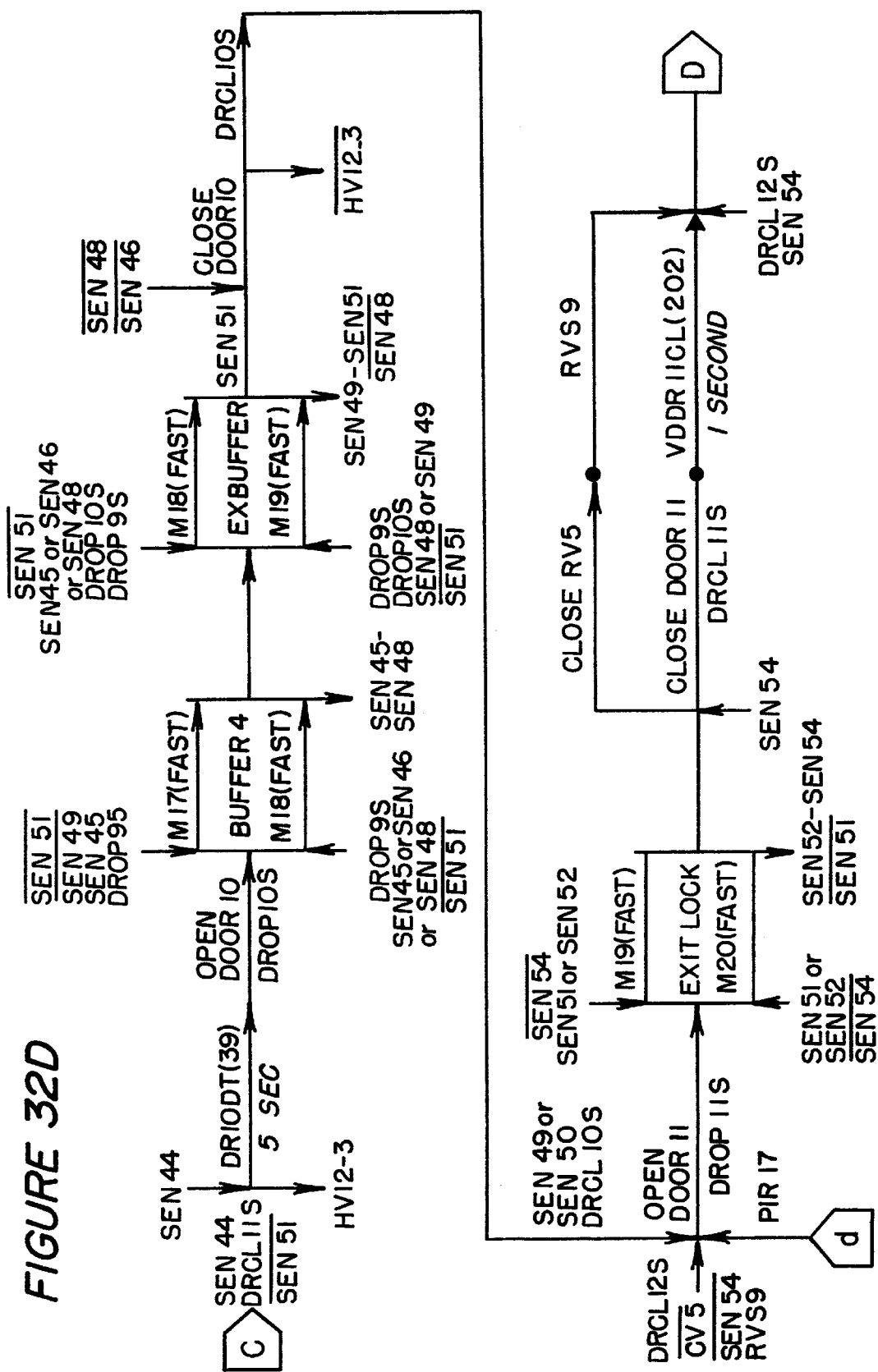
Figure 32E:
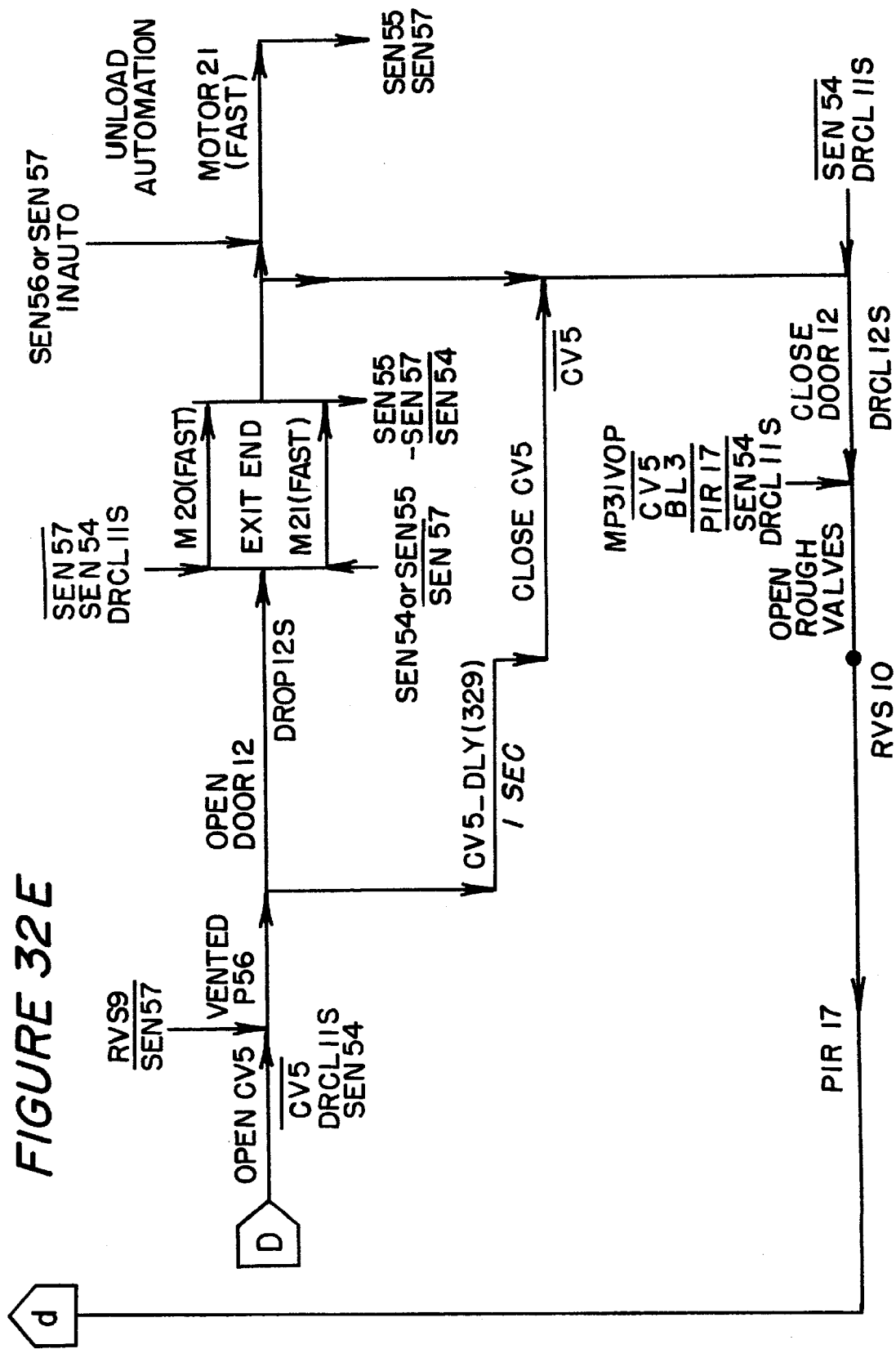

The electronic control system of the present invention will be described with regard to FIGS. 12, 29 and 30. FIG. 12 is a diagram of the vacuum and chamber pumping system of the present invention, including general representations of the location of the various signals and components controlled, or read by, the digital input/output of programmable logic controller 2902. FIGS. 32A-B represent a logical flow diagram of the programmable logic software controlling the motor assemblies powering transport platform arranged in chambers 12–30 in apparatus 10 of the present invention.

Figure 29:
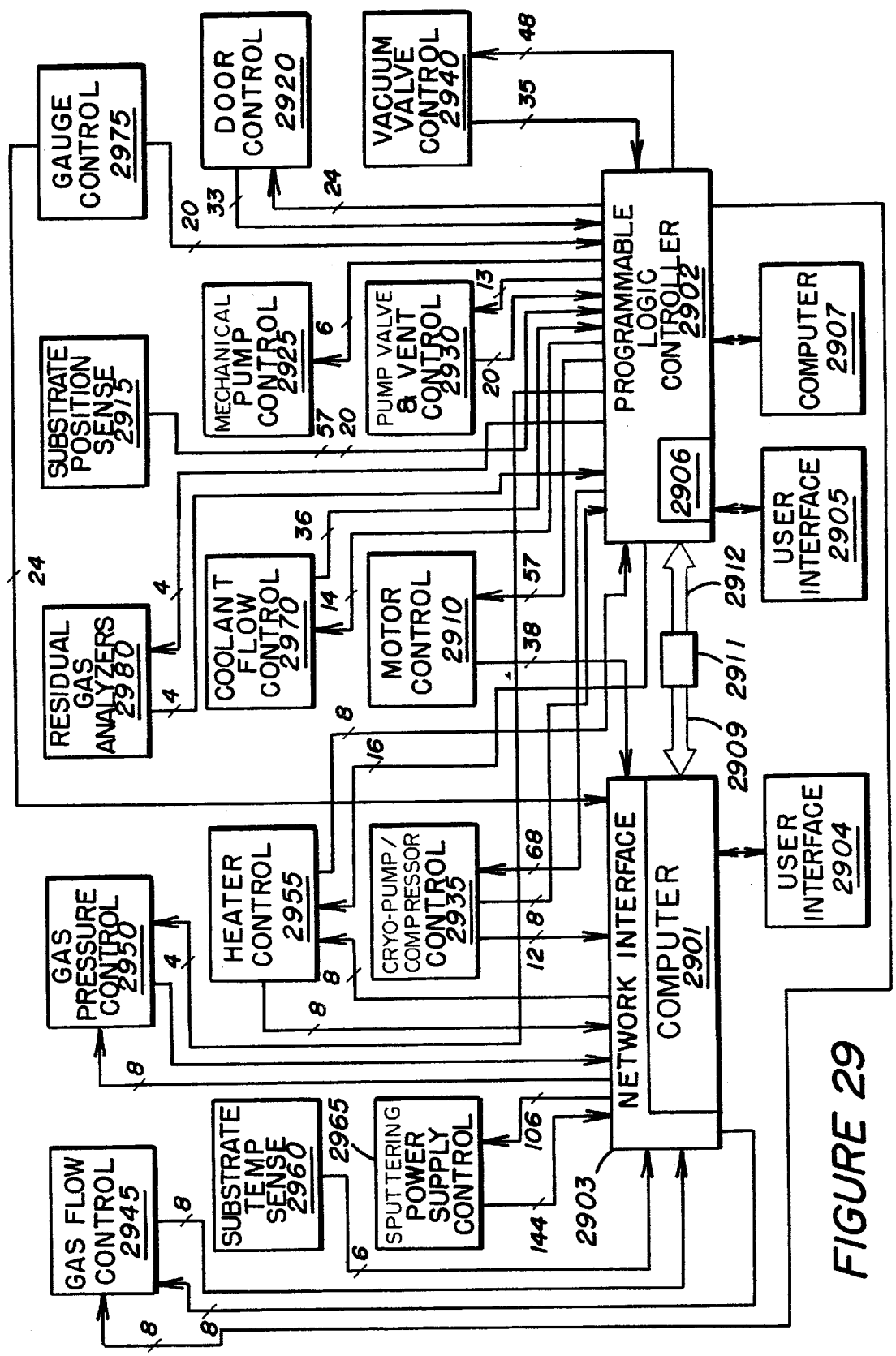
FIG. 29 is a block diagram of the electronic control system of the present invention.

Referring to FIG. 29, the major functional elements of the control system of the present invention are shown. Since both digital and analog input/output must be provided for in one embodiment, two main process controllers are used: a programmable process logic controller 2902, preferably an Allen Bradley PLC-5 programmable process logic controller, and an IBM-compatible, Intel-type 80386 or 80486 microprocessor based, computer 2901. It should be understood by those skilled in the art after review of the specification that the particular choice of process controllers is not crucial to the invention, as long as the process controller(s) can sufficiently handle input/output (I/O) in both analog and digital form to meet the comprehensive requirements of the control system described herein.

The Allen Bradley PLC-5 is manufactured by Allen Bradley Company, Milwaukee, Wis., and includes at least one PLC-5 processor module and a number of input/output modules attached thereto. The input/output modules provide an expandable number of inputs and outputs to handle any number of digital I/O signals.

Programmable logic controller 2902 monitors digital input and provides digital output to those elements of the sputtering apparatus which require two-state control signals. These elements are described in detail below. Allen Bradley PLC-5 uses logic control software configured as "ladder" logic table diagram, a copy of which is included in Section M, to control input and output. In general, this software allows programming of the sensory input and output in a Boolean-type fashion along a series of horizontal timing "rungs". The entire "ladder" is scanned, top to bottom, every 0.030–0.040 second, and each addressed element of I/O is examined by the processor. Each rung is programmed with both internal and external I/O, and generates an output command—either internal or external—if each element in the horizontal rung is "true". In this manner, it will be recognized that horizontally linked elements are ANDed together, while vertically linked elements are ORed. Each rung may be cross-referenced and nested to other individual rungs to achieve the desired logical output. The output of each rung may comprise an "enable," "latch" or "unlatch" signal, depending on the nature of the timing utilized in the particular program.

Computer 2901 primarily controls analog input/output to the various elements of sputtering apparatus 10 via a SIX-NET network interface 2903, such as that manufactured by Digitronix SIXNET, Inc., Clifton Park, N.Y., although some digital input/output functions are handled by the computer 2901. The SIXNET network interface 2403 is coupled to computer 2902 via 307,200 baud SIXNET Model 60-232/ N-DL network modem (not shown) coupled to a RS-232 serial port on, for example, a peripheral extension card provided in an expansion slot of computer 2901. Such an extension card may comprise, for example, an IBM Real Time Interface Co-Processor (ARTIC) card manufactured by International Business Machines, Boca Raton, Fla.

In order to handle a sufficient quantity of digital and analog I/O, the network interface 2903 comprising a SIX-NET I/O network may include eight SIXNET 60 I/O MUX-FEB multiplex stations, each of which may include two RS-232 serial ports or alternative expansion capability, and sixteen dedicated I/O terminals. The multiplex stations are interlinked by the 307K baud SIXNET network interface. Data I/O of each such station may be configured as the constraints of the physical facility and sputtering apparatus 10 require to couple the necessary I/O signals to the network interface 2903. Network interface 2903 may include SIX-NET 60-A/D 16–32 analog-to-digital converters, 6-D/A 12B-8 digital-to-analog converters, and 6-I032 FET digital/ analog input/output modules to handle additional digital and analog I/O as required.

Programmable logic controller 2902 and computer 2901 may communicate via a data highway 2911, utilizing an RS-232 serial bus coupled between one RS-232 serial port of the ARTIC peripheral card (discussed above) located in computer 2901, and an Allen Bradley 1171-KF2-B communications interface 2911. Interface 2911 is coupled to programmable logic controller 2902 via serial data highway 2912.

Computer 2901 utilizes a user interface and system control software to monitor, control, generate alarms and store data for apparatus 10. One such software suitable for this purpose is "The Fix", produced by Intellution Corporation, Norwood, Mass. The software allows development of a graphic interface environment for data input/output by creating signal control databases linking the particular interface environment to specific control signals output from, and data sensing signals input to, computer 2901. Thus, input data is transmitted via network interface 2903 from the various components of apparatus 10 to computer 2901 to be provided as direct readout to the user I/O environment created using the interface and control software to provide easily readable data to the system operator and/or to create output flags to programmable logic controller 2902.

A limited number of output signals are provided by The Fix software to programmable logic controller 2902. These signals comprise combinational results of specific input signals and act as triggers for programmable logic controller 2902. This specific programming code utilized in "The Fix" software to generate these signals is included as Section N.

As with the particular process controllers utilized in the present invention, it will be noted by those skilled in the art that the particular software utilized in the process controllers to provide data input/output is not crucial to the substance of the invention; any suitable process control software may be utilized within the scope of the invention to generate any number of suitable user interfaces.

A second, IBM compatible computer 2907 is coupled to programmable logic controller 2902. Computer 2907 may be utilized as a separate programming computer allowing on-line monitoring, debugging, and programming of the ladder logic software in programmable logic controller 2902 utilizing a debugging software, such as that manufactured by ICOM Incorporated, Milwaukee, Wis.

User interfaces are provided for both programmable logic controller 2902 and computer 2901. User interface 2905 coupled to programmable logic controller 2902 may comprise a NEMATRON touch screen, manufactured by NEMATRON, Inc., Ann Arbor, Mich., which allows data input/output through a series of custom designed, touch sensing, display screens. When utilizing the NEMATRON touch-screen with the Allen Bradley PLC-5, a BASIC module 2906 is provided in the Allen Bradley and coupled to the NEMATRON. The BASIC module is utilized for selecting the display screens on the NEMATRON and for linking particular screen input/output to the data input/output of the Allen-Bradley PLC-5.

Computer 2901 is coupled to user interface 2904, which preferably comprises a standard high resolution graphics display monitor and keyboard. An EGA or VGA type high-resolution graphics display, such as the NEC Multisync II, manufactured by NEC Information Systems, Inc., Boxborough, Mass. is suitable for use as user interface 2904. Again, it should be understood that any conventional input/ output interface may be utilized with the process controllers of the electronic control system while remaining within the scope of the invention.

The electronic control system of the present invention governs three major functions: movement of the substrate through apparatus 10; sputtering process control within apparatus 10; and status indication for apparatus 10. Referring to FIG. 29, movement of the pallet 800 and disk substrate 510 through the process is governed by the electronic control system through motor control system 2910, position sensing system 2915, and door control system 2920. Process control and status indication are governed by mechanical pump control system 2925, pump valve and vent control system 2930, cryogenic pump and compressor control system 2935, vacuum valve control system 2940, gas flow control system 2945, gas pressure control system 2950, heater control system 2955, substrate temperature sensing system 2960 sputtering power supply control system 2965, coolant control system 2970, gauge control system 2975 and residual gas analyzers 2980.

With reference to FIG. 29, the elements of the electronic control system, and their relationship to programmable logic controller 2902, computer 2901, and network interface 2903 are hereinafter described. It should be understood by those skilled in the art that the elements defined in FIG. 29 are arranged in the manner shown for explanation purposes only; various modifications of the system are contemplated as being within the scope of the invention.

10. Heater Control System 2955

Substrate heating, including dwell heating in chamber 14 and passby heating in chamber 16, to maintain a uniform temperature gradient over the substrate surface is governed by heater control system 2955. Control of both the "dwell" and "passby" heater banks 1510A, 1510B, 1510C, 1510D, 1620A, 1620B, 1620C, 1620D, 1818A, 1818B, 1818C, 1920A, 1920B, 1920C, 1920D, discussed in Section H of this specification, may be provided by eight Emerson Spectrum III Heater Controllers, manufactured by Emerson Industrial Controls, Grand Island, N.Y. The Emerson Spectrum III controllers allow digital heater temperature setpoint control of the quartz lamp heating elements discussed in section H. Thus, heater setpoints once set will be maintained by each Spectrum III.

In the present embodiment, heater control system 2955 thus utilizes: eight digital outputs of programmable logic controller 2902 providing on/off control signals RH1A-RH3C to the Emerson Spectrum III controllers; eight digital outputs of programmable logic controller 2902 controlling high/low output enable RH1A-RH3C for the Emerson Spectrum III controllers; eight inputs of programmable logic controller 2902 receiving heater fault signals H1A0FLT-H3C0FLT; eight analog outputs from network interface 2903 controlling the voltage setpoints of heater bank sets 1510A/1510B, 1510C/1510D, 1620A/1620B, 1620C/1620D, 1818A/1818D, 1818B/1818E, 1818C/1818F, 1920A/1920B, and 1920C/1920D, and eight analog inputs to network interface 2903 monitoring each heater bank set's current setpoint output HSP1–HSP8.

A preferable embodiment of heater control system 2955 would provide individual control of each of heater banks 1510A–1510D, 1620A-1620B, 1818A–1818D, and 1920A–1920D. Such an embodiment would include additional hardware lines to control each of the heater banks coupled to the electronic control system. In an embodiment using Emerson Spectrum 3 controllers, sixteen such controllers would be utilized and sixteen digital outputs of programmable logic controller 2902 would be needed to provide on/off control signals, sixteen digital outputs of programmable logic controller 2902 would be required to provide high/low output enable signals, sixteen additional outputs of programmable logic controller 2902 would be utilized for heater FALSE signals, sixteen analog outputs from network interface 2903 would be needed to control voltage setpoints of the heater banks, and eight analog input signals to network interface 2903 would be utilized to monitor each heater banks current setpoint output.

11. Substrate Temperature Sensorina System 2960

Six Mikron temperature sensors (not shown) may be provided at various locations throughout the sputtering apparatus in a movable configuration to measure the temperature gradient over the surface of the substrate as it proceeds through various sections of the sputtering apparatus. The Mikron sensors provide 0–5 volt analog output signals TEMP1–TEMP6 through network interface 2903 for output to user interface 2904, thereby allowing the system operator to monitor at every cycle and react each heater bank 1818A–1818C output to maintain a uniform temperature gradient across the surface of the substrate as it proceeds through the apparatus. In general, sensors may be provided in chamber 16 or 18.

L. Process In General

Examples 1 and 2 illustrate process parameters for 40 sputtering apparatus 10 to produce 950 Oe and 1200 Oe, respectively, hard drive disks.

EXAMPLE 1

As illustrated in FIG. 2, once engaged by substrate carrier 1450, pallet 800 loaded with disk substrates 510 proceeds through door D1 into load lock chamber 12. After pallet 800 enters load lock chamber 12, door D1 closes. Load lock chamber 12 is pumped down to 50 microns (50 mTorr) in 20 seconds by mechanical roughing pump MP1. Door D2 opens, allowing pallet 800 to proceed at 6 ft/min into dwell heating chamber 14. Dwell heating chamber 14 has already been evacuated by cryo pump C1 to $10^{-5}$ Torr (0.01 microns). As pallet 800 proceeds through the chamber, it triggers proximity position sensors which in turn initiate heaters. Heating lamp warmup time is negligible since, during sputtering operations, the lamp filaments are kept warm by a low power level. Pallet 800 and disk substrates 510 soak in dwell heating chamber 14 for 30 seconds with the temperature about 220° C. During this soak period, the heating power applied is 3.1 kW per bank. Argon enters through gas manifolds to backfill dwell heating chamber 14 and equalize the internal pressure before door D3 opens, allowing pallet 800 to proceed. This backfill also maintains pressure equilibrium throughout the apparatus, essential to stabilizing sputtering processes. Door D3 opens to passby heating chamber 16, triggering the initiation of passby heaters. Pallet 800 enters passby heating chamber 16 and after clearing sensor SEN10, triggers the closure of door D3. This chamber also has been evacuated by cryo pump C2 to about $10^{-5}$ Torr (0.01 microns). Passby heating banks 1818A–1818F operate using 7.6 kW per bank. Lamps 1514 on the leading edge of the pallet reduce power as pallet 800 exits into dwell chamber 18 at 6 ft/min. Pallet 800 proceeds through dwell chamber 18 which has already been evacuated by cryo pump C3 to $10^{-5}$ Torr. The pallet proceeds at 6 ft/min past heat reflective panels 2120.

Pallet 800 enters chromium sputtering chamber 20 maintained at 9–12 microns (9–12 mTorr) of argon pressure with argon flow at 300 standard cubic centimeters per minute (sccm). Pallet 800 travels at 6 ft/min as it passes sputtering targets 2226–2229. The sputtering power is 7.5 kW per cathode, with a 1,000 Å thick chromium film deposited. Transport speed through dwell chamber 22A, buffer chamber 24A and dwell chamber 22B is 12 ft/min through open doors D5 and D6. These three chambers are pumped by cryo pumps C4, C5, and C6. Pallet 800 enters magnetic sputtering chamber 26 maintained at 9–12 microns (9–12 mTorr) of argon by cryo pumps C6 and C7 with argon fLow at approximately 400 sccm. The transport speed through sputtering chamber 26 is 6 ft/min. The sputtering power is 7.5 kW per cathode, depositing a 800 Å thick CoCrTa film. Transport speed through dwell chambers 22C and 22D and buffer chamber 24B is 6 ft/min. Dwell chambers 22C, 22D and buffer chamber 24B are pumped by cryo pumps C7, C8 and C9. Pallet 800 enters carbon sputtering chamber 28 maintained at 9–10 microns (9–12 mTorr) by cryo pumps C9 and C10 with argon and up to 15% hydrocarbon gas like ethylene or acetylene flowing at 100 sccm. The transport speed is 2.8 ft/min as the pallet passes the sputtering targets in carbon sputtering chamber 28. Sputtering power is 7 kW per cathode with a film thickness of 350 Å. Transport speed through dwell chamber 22E, buffer chamber 24C and exit buffer chamber 29 is 6 ft/min with doors D9 and D10 opening and closing sequentially to allow pallet 800 to proceed. Dwell chamber 22E is pumped by cryo pumps C10 and C11, buffer chamber 24C and exit buffer chamber 29 are pumped by cryo pump C12. Argon is backfilled into exit buffer chamber 29 by cryo pump C12 to equalize the pressure differential existing with respect to exit lock chamber 30. Pallet 800 next proceeds through exit lock chamber 30 which is vented to the atmosphere by chamber vent valve CV5 in 10 seconds. Pallet 800 then proceeds to robotic unloading station 45.

To produce a 1,200 Oe magnetic film, the soak time in dwell heating chamber 14 may be increased to about 50 seconds to allow the substrate temperature to increase to approximately 250° C. and/or the pallet transport speed through chromium sputtering chamber 20 may be reduced in order to allow a thicker deposition of a chromium underlayer. Adjustment of soak time and/or substrate temperature parameters depends on the life cycle of the pallet—a pallet which has proceeded through numerous sputtering runs will have a thicker film deposition which can absorb more water and consequently would have more water to outgas before film deposition.

The many features and advantages of the apparatus and process of the present invention will be apparent to those skilled in the art from the description of the preferred embodiments and the drawings.

Thus, a high throughput process and apparatus which accomplishes the objectives of the invention and provides the above advantages by providing a comprehensive in-line sputtering system utilizing matched component elements to process multiple large single sheet or pallet transported discrete substrates in a continuous, variable speed, sputtering process has been described. Such an apparatus and method can process up to 3,000 95 mm disk substrates, and 5,300 65 mm disk substrates, per hour. Such high volume production offers both high volume production and, consequently, cost savings per disk on the order of $4.00 per disk over prior art sputtering apparatus and processes. As noted throughout this specification, such an apparatus and process is achieved through a novel combination of process and structural elements involved in disk preparation, provision of a sputtering environment, transportation of substrates through the sputtering environment at rapid speeds and in a contaminant free manner, heating the substrates to optimal thermal levels for sputtering, and sputtering the substrates through a series of substantially isolated, non-crosscontaminating sputtering steps.

The apparatus of the present invention provides a high-speed in-line sputtering apparatus for producing superior multilayer films on substrates, such as disks suitable for use in Winchester-type hard disk drives. The process of the present invention provides an improved method of providing multilayer coatings to a variety of substrate types at a much greater rate than prior art methods.

Also described herein are a novel means for heating substrates to be coated, a novel sputtering magnetron design, a novel, variable speed, overhead, non-contaminating substrate transportation system and a comprehensive, centralized, programmable electronic means for controlling the apparatus and process are provided. Still further, when the process and apparatus are used for providing magnetic coatings for substrates, such as disks, to be utilized in hard disk drives using Winchester-type technology, a unique disk texturing method for improving the disk's magnetic recording properties, and a novel disk carrier (or pallet) design which contributes to uniform substrate heating characteristics in a large, single, high capacity pallet, are also provided herein. Numerous variations are possible as will be apparent to those skilled in the art; such variations are intended to be within the scope of the invention as defined by this specification and the following claims are intended to cover all the modifications and equivalents falling within the scope of the invention.

What is claimed is:

1. A high throughput sputtering apparatus having a plurality of integrally matched components, said components comprising:

means for sputtering a multi-layer coating onto a plurality of substrates, said means for sputtering including a series of sputtering chambers each having relative isolation from adjacent chambers to reduce cross contamination between the coating components being sputtered onto substrates therein, said sputtering chambers being isolated from ambient atmospheric conditions;

means for transporting said plurality of substrates through said means for sputtering at variable velocities;

means for evacuating said means for sputtering to a vacuum level within a pressure range sufficient to enable sputtering operation;

means for heating said plurality of substrates to a temperature conducive to sputtering said multi-layer coatings thereon, said means for heating providing a substantially uniform temperature profile over the surface of said substrate, said means for heating comprising a plurality of heating chambers positioned along a substrate transport path wherein a plurality of heating lamps are mounted within the heating chambers, said plurality of heating lamps having rapid heat-up time; and control means for providing control signals to, and for receiving feedback input from, said means for sputtering, means for transporting, means for evacuating, and means for heating, said control means being programmable to automatically control said means for sputtering, means for transporting, means for evacuating and means for heating to synchronize said means for sputtering, means for transporting, and means for heating, the control means providing the feedback input to a user interface and being responsive to input from the user interface;

wherein the control means alters the control signals in real time responsive to the input from the user interface, the control means thereby allowing a system operator to precisely control the multi-layer coating applied to the substrates.

2. A substrate heating system for rapidly and uniformly heating substrates in a high throughput sputtering system for providing magnetic recording media, comprising:

a) a plurality of heating chambers positioned along a substrate transport path through which the substrates are transported;

b) heating means for providing radiant energy to the substrates;

c) a plurality of heat-reflective trays mounted in the plurality of heating chambers along the path, in which trays the heating means is located, for reflecting radiant energy incident thereon back toward the substrates so as to uniformly heat the substrates; and d) cooling means for cooling the heat-reflective trays to protect the trays from overheating.

3. A substrate heating system as recited in claim 2, wherein the heating means includes a plurality of heating lamps.

4. A substrate heating system as recited in claim 3, wherein the heating lamps have rapid heat-up time.

5. A substrate heating system for rapidly and uniformly heating substrates in a high throughput sputtering system for providing magnetic recording media, comprising:

a) a plurality of first heating chambers positioned along a substrate transport path through which the substrates are transported;

b) heating means for providing radiant energy to the substrates;

c) a plurality of heat-reflective trays mounted in the first heating chamber, in which trays the heating means is located, for reflecting radiant energy incident thereon back toward the substrates so as to uniformly heat the substrates;

d) at least one second heating chamber positioned along the substrate transport path through which the substrates are transported;

e) a plurality of heat-reflective panels mounted in each of the second heating chambers for uniformly reflecting radiant energy incident thereon toward the substrates; and f) means for cooling the plurality of heat-reflective trays to protect the trays from overheating.

6. A substrate heating system for rapidly and uniformly heating substrates being transported along a substrate transport path in a high throughput sputtering system for providing magnetic recording media, comprising:

a) at least one first heating chamber positioned along the path for providing an environment in which to perform a first heating cycle on the substrates;

b) a plurality of first heating banks mounted within each of the first chambers, the first heating banks comprising a plurality of heating lamps for providing radiant energy to the substrates during the first heating cycle, wherein the lamps are arrayed in a plurality of horizontal or vertical rows;

c) at least one second heating chamber positioned along the path for providing an environment in which to perform a second heating cycle on the substrates, d) a plurality of second heating banks mounted within each of the second chambers comprising a plurality of heating lamps for providing radiant energy to the substrates during the second heating cycle;

e) at least one third heating chamber positioned along the path for providing an environment in which to perform a third heating cycle on the substrates; and f) a plurality of heat-reflective panels mounted in each of the third heating chambers for uniformly reflecting radiant energy incident thereon toward the substrates.

7. A substrate heating system as recited in claim 6, wherein the lamps are provided in a plurality of first rows and a plurality of second rows, the first rows being interdigitated with the second rows.

8. A substrate heating system as recited in claim 6, further comprising control means for increasing or decreasing the radiant energy emitted from individual heating lamps independent of others of the heating lamps so as to provide a substantially uniform temperature profile for the substrates across the pallet.

9. A substrate heating system for rapidly and uniformly heating substrates secured to a pallet traveling along a substrate transport path in a high throughput sputtering system for providing magnetic recording media, comprising:

a) at least one heating chamber positioned along the substrate transport path;

b) a plurality of heating banks mounted within the heating chamber, each bank comprising a plurality of heating lamps for providing radiant energy to the substrates; and c) control means for increasing or decreasing the radiant energy emitted from individual heating lamps independent of others of the heating lamps so as to provide a substantially uniform temperature profile for the substrates across the pallet wherein the control means decreases the radiant energy emitted from individual heating lamps proximal to a leading edge of the pallet as the pallet exits the heating chamber, such that the substrates at trailing edge of the pallet are not overheated relative to the substrates near a leading edge of the pallet.

10. A substrate heating system as recited in claim 9, wherein the control means controllably adjusts the temperature of a top section of the pallet and a bottom section of the pallet independently of a middle section of the pallet.

11. A substrate heating system as recited in claim 10, wherein the control means can controllably adjust the temperature of the top section independently of the bottom section.

12. A substrate heating system for rapidly and uniformly heating substrates secured to a pallet traveling along a substrate transport path in a high throughput sputtering system for providing magnetic recording media, comprising:

a) at least one heating chamber positioned along the substrate transport path;

b) a plurality of heating banks mounted within the heating chamber, each bank comprising a plurality of heating lamps for providing radiant energy to the substrates, said plurality of heating lamps having rapid heat-up time;

c) sensing means within said at least one heating chamber for sensing the temperature of the substrates at predetermined positions of the pallet; and d) control means for increasing or decreasing the radiant energy emitted from individual heating lamps independent of others of the heating lamps in response to the temperature sensed by the sensing means so as to provide a substantially uniform temperature profile for the substrates across the pallet.

13. A substrate heating system for rapidly and uniformly heating substrates to a temperature conducive to sputtering in a high throughput sputtering system for providing magnetic recording media, comprising:

a) at least one first heating chamber positioned along a substrate transport path for providing an environment in which to perform a first heating cycle on the substrates being transported through the path;

b) a plurality of first heating banks mounted within a plurality of heat-reflective trays, which trays are in turn mounted within each of the first chambers, which first heating banks comprise a plurality of heating lamps for providing radiant energy to the substrates during the first heating cycle, wherein the lamps are provided in a plurality of first rows and a plurality of second rows, the first rows being interdigitated with the second rows;

c) first sensing means for sensing substrate temperature within each of the first heating chambers;

d) at least one second heating chamber positioned along the path for providing an environment in which to perform a second heating cycle on the substrates;

e) a plurality of second heating banks mounted within a plurality of heat-reflective trays, which trays are in turn mounted within each of the second chambers, which second heating banks comprise a plurality of heating lamps for providing radiant energy to the substrates during the second heating cycle;

f) second sensing means for sensing substrate temperature within each of the second heating chambers; and g) control means associated with the first sensing means and the second sensing means for controlling the substrate temperature in each of the first heating chambers and in each of the second heating chambers so as to uniformly heat the substrates.

14. A substrate heating system as recited in claim 13, further comprising:
   a) at least one third heating chamber positioned along the path for providing an environment in which to perform a third heating cycle on the substrates; and
   b) a plurality of heat-reflective panels mounted in each of the third heating chambers for uniformly reflecting radiant energy incident thereon toward the substrates.

15. A substrate heating system as recited in claim 13, wherein the plurality of substrates is further heated by radiant energy reflected from the plurality of heat-reflective trays.

16. A substrate heating system as recited in claim 13, further comprising a means for cooling the heat-reflective trays to protect the trays from overheating .

\* \* \* \* \*

UNITED STATES PATENT AND TRADEMARK OFFICE
CERTIFICATE OF CORRECTION

PATENT NO. : 5,972,184
DATED : Oct. 26, 1999
INVENTOR(S) : Dennis R. Hollars, et al.

It is certified that error appears in the above-identified patent and that said Letters Patent is hereby corrected as shown below:

Col. 23, line 29: "substrates,"
should be "substrates;"

Col. 23, line 64: after pallet, insert ","

Col. 24, line 2: "at trailing"
should be "at a trailing"

Col. 24, lines 25-26: "predeternuned"
should be "predetermined"

Signed and Sealed this

Fifteenth Day of May, 2001

NICHOLAS P. GODICI

Attest:

Attesting Officer

Acting Director of the United States Patent and Trademark Office